US009833836B2

(12) United States Patent
Magdassi et al.

(10) Patent No.: US 9,833,836 B2
(45) Date of Patent: Dec. 5, 2017

(54) CORE-SHELL METALLIC NANOPARTICLES, METHODS OF PRODUCTION THEREOF, AND INK COMPOSITIONS CONTAINING SAME

(75) Inventors: Shlomo Magdassi, Jerusalem (IL); Michael Grouchko, Jerusalem (IL); Alexander Kamyshny, Jerusalem (IL)

(73) Assignee: YISSUM RESEARCH DEVELOPMENT COMPANY OF THE HEBREW UNIVERSITY OF JERUSALEM, LTD., Jerusalem (IL)

( * ) Notice: Subject to any disclaimer, the term of this patent is extended or adjusted under 35 U.S.C. 154(b) by 624 days.

(21) Appl. No.: 13/000,415

(22) PCT Filed: Jun. 23, 2009

(86) PCT No.: PCT/IL2009/000624
§ 371 (c)(1),
(2), (4) Date: Mar. 21, 2011

(87) PCT Pub. No.: WO2009/156990
PCT Pub. Date: Dec. 30, 2009

(65) Prior Publication Data
US 2011/0183128 A1    Jul. 28, 2011

Related U.S. Application Data

(60) Provisional application No. 61/074,763, filed on Jun. 23, 2008.

(51) Int. Cl.
C09D 11/30    (2014.01)
B82Y 30/00    (2011.01)
(Continued)

(52) U.S. Cl.
CPC ............. B22F 1/0022 (2013.01); B01J 13/02 (2013.01); B22F 1/0018 (2013.01); B22F 1/02 (2013.01);
(Continued)

(58) Field of Classification Search
USPC ......................................................... 252/500
See application file for complete search history.

(56) References Cited

U.S. PATENT DOCUMENTS

2002/0149656 A1 * 10/2002 Nohr et al. ...................... 347/95
2003/0039860 A1 *  2/2003 Cheon et al. ............. 428/694 T
(Continued)

FOREIGN PATENT DOCUMENTS

| KR | 10-2006-0085704 A | 7/2006 |
|----|-------------------|--------|
| WO | 02/096262 A2      | 12/2002 |
| WO | 2007/140479 A1    | 12/2007 |

OTHER PUBLICATIONS

Lee et al. "Redox-Transmetalation Process as a Generalized Synthetic Strategy for Core-Shell Magnetic Nanoparticles", Journal of the American Chemical Society 2005, 127, pp. 16090-16097, published on web on Oct. 28, 2005; attached to the case file as a PDF.*

(Continued)

Primary Examiner — Katie L Hammer
(74) Attorney, Agent, or Firm — Vorys, Sater, Seymour & Pease LLP

(57) ABSTRACT

Provided is a composition including a plurality of multi-metallic nanoparticles each consisting essentially of a core including at least one first metal (Me1) and a continuous shell including atoms of at least one second metal (Me2). Optionally, the continuous shell of Me2 atoms protects the Me1 atoms from oxidation at all temperatures less than 150° C.

10 Claims, 14 Drawing Sheets

(51) Int. Cl.

| | |
|---|---|
| *B22F 1/02* | (2006.01) |
| *B22F 9/18* | (2006.01) |
| *B22F 1/00* | (2006.01) |
| *B01J 13/02* | (2006.01) |
| *B22F 9/24* | (2006.01) |
| *C09D 11/322* | (2014.01) |
| *C09D 11/52* | (2014.01) |
| *H05K 1/09* | (2006.01) |

(52) U.S. Cl.
CPC ............... *B22F 1/025* (2013.01); *B22F 9/18* (2013.01); *B22F 9/24* (2013.01); *B82Y 30/00* (2013.01); *C09D 11/30* (2013.01); *C09D 11/322* (2013.01); *C09D 11/52* (2013.01); *H05K 1/097* (2013.01); *B22F 2001/0092* (2013.01); *B22F 2301/10* (2013.01); *B22F 2998/00* (2013.01); *H05K 2201/0218* (2013.01); *Y10T 428/24901* (2015.01)

(56) References Cited

U.S. PATENT DOCUMENTS

| | | | |
|---|---|---|---|
| 2005/0078158 A1 | 4/2005 | Magdassi et al. | |
| 2006/0062902 A1 | 3/2006 | Sager et al. | |
| 2006/0177660 A1* | 8/2006 | Kumar et al. | 428/403 |
| 2006/0226398 A1* | 10/2006 | Hori et al. | 252/500 |
| 2007/0031722 A1* | 2/2007 | Adzic et al. | 429/44 |
| 2007/0212562 A1* | 9/2007 | Shim et al. | 428/548 |
| 2009/0301344 A1* | 12/2009 | Chretien | B01J 13/02 106/31.13 |

OTHER PUBLICATIONS

Aslam, et al., "Controlled Synthesis and Stability of Co@SiO2 Aqueous Colloids", J. Am. Ceram. Soc., vol. 90, No. 3, pp. 950-956, (2007).

Fu, et al., "Preparation and characteristics of core-shell structure nickel/silica nanoparticles", Colloids and Surfaces A: Physicochem. Eng. Aspects, vol. 262, pp. 71-75, (2005).

Grouchko, et al., "Formation of air-stable copper-silver core-shell nanoparticles for inkjet printing", J. Mater. Chem., vol. 19, pp. 3057-3062, (2009).

Grouchko, et al., "Synthesis of copper nanoparticles catalyzed by pre-formed silver nanoparticles", J Nanopart Res, vol. 11, pp. 713-716, (2009).

Han, et al., "Preparation of Gold-Polypyrrole Core-shell Nanoparticles", Molecular Crystals and Liquid Crystals, vol. 371, No. 1, pp. 127-130, (2001).

Kanninen, et al., "Influence of ligand structure on the stability and oxidation of copper nanoparticles", Journal of Colloid and Interface Science, vol. 318, pp. 88-95, (2008).

Kim, et al., "Highly Conductive Ink Jet Printed Films of Nanosilver Particles for Printable Electronics", Electrochemical and Solid-State Letters, vol. 8, No. 11, pp. J30-J33, (2005).

Mandal, et al., "CocoreAushell nanoparticles: evolution of magnetic properties in the displacement reaction", J. Mater. Chem., vol. 17, pp. 372-376, (2007).

Shpaisman, et al., "Synthesis and Characterization of Air-Stable Iron Nanocrystalline Particles Based on a Single-Step Swelling Process of Uniform Polystyrene Template Microspheres", Chem. Mater., vol. 18, pp. 396-402, (2006).

International Search Report for International Application No. PCT/IL2009/000624, three pages, dated Oct. 27, 2009.

* cited by examiner

US 9,833,836 B2

CORE-SHELL METALLIC NANOPARTICLES, METHODS OF PRODUCTION THEREOF, AND INK COMPOSITIONS CONTAINING SAME

This is a National Phase Application filed under 35 U.S.C. 371 as a national stage of PCT/IL2009/000624, filed on Jun. 23, 2009, an application claiming the benefit under 35 USC 119(e) of U.S. Provisional Application No. 61/074,763, filed on Jun. 23, 2008, the content of each of which is hereby incorporated by reference in its entirety.

FIELD OF THE INVENTION

This invention relates to bi-metallic nanoparticles having a core containing a first metal (Me1) and a shell containing a second metal (Me2), as well as to methods of producing these particles and their use in formation of printed patterns.

BACKGROUND OF THE INVENTION

Metallic nanoparticles have unique properties which differ from those of bulk and atomic species. These unique properties elicit scientific and practical interest.

The difference between metallic nanoparticles and bulk and atomic species is related to differences in electronic structure. The nanoparticles have relatively large surface area with a high percentage of surface atoms. Metal nanoparticles exhibit a drastic decrease in melting point compared to that of the bulk material and/or are characterized by enhanced reactivity of the surface atoms and/or unique optical properties.

Nano-sized materials are acknowledged to have novel properties and applications in electrochemistry, microelectronics, optical, electronic and magnetic devices and sensors, new types of active and/or selective catalysts and biosensors have been previously proposed.

Availability of stable concentrated nano-colloids of metals with low resistivity would create new possibilities in computer-defined direct-write noncontact technologies, such as ink-jet printing, for deposition of metallic structures on various substrates.

Ink-jet is a non-impact dot-matrix printing technology, in which droplets of ink are jetted from a small orifice directly onto a specified position on a substrate to create an image. Today the majority of activities in ink-jet printing are in the drop-on-demand methods. Depending on the mechanism used in the drop formation process, the technology can be categorized into four methods: thermal, piezoelectric, electrostatic, and acoustic ink-jet. Most commercially available drop-on-demand ink-jet printers currently use either thermal or piezoelectric principles Ink chemistry and formulation represents a major challenge in ink-jet printing. Ink-jet inks must meet strict physico-chemical standards in order to achieve desired performance and reliability of the printing apparatus and/or to achieve acceptable printed patterns. The majority of inks in office and home ink-jet printers are water-based inks. Typical water-based ink-jet inks are composed of a large number of components, aimed at meeting the complex requirements for good printing performance. In particular, in the case of pigment-based inks, the pigment should be in the nanometer size range to prevent sedimentation and orifice clogging.

In addition to conventional graphic applications, ink-jet printing has been applied to various other applications, including fabrication of transistors and organic light emitting diodes, polymer films, structural ceramics and biotechnology. Currently, these applications have not been developed commercially.

A well-known approach to overcome the oxidation problem is based on the protection of nanoparticles with a protecting shell formed by ligands [P. Kanninen, C. Johans, J. Merta, K. Kontturi, J. Coll. Inter. Scl 2008, 318, 88; KR Patent 20060085704 to Choi Soon Lim et al. and Han et al. 2001 Mol. Cryst And Liq. Cryst 371:127-130], polymers [N. Shpaisman, S. Margel, Chem. Mater. 2006, 18, 396.] or silica [W. Fu, H. Yang, L. Chang, M. Li, H. Bala, Q. Yu, G. Zou, Colloids and Surfaces A: Physicochem. Eng. Aspects 2005, 262, 71 and M. Aslam, S. Li, V. P. Dravid, J. Am. Ceram. Soc. 2007, 90, 950.]. The main disadvantage of this approach is the formation of a nonmetallic non-conductive coating. The other approach may be deposition of a thin layer of a protecting noble metal shell, for example Ag, Au or Pt, on the preformed nanoparticles (core nanoparticle), which protect the latter from oxidation, while leaving most of the core properties unchanged. However, it has been reported that such a process may lead to undesirable formation of individual particles of the second metal, in addition or instead of formation of a shell around the preformed core nanoparticles [S. Mandal, K. M. Krishnan, J. Mater. Chem. 2007, 17, 312.]. To overcome this drawback, a selective reduction method, which should take place only at the surface of the core particle, is required. For example, copper-silver core shell nanoparticles were formed at 250 C in a hydrocarbon based solvent to form conductive ink [U.S. Patent application publication 2007/0212562]. It is clear that using a hydrocarbon medium for reaction is not favorable due to cost, environmental and health considerations, and performing the reaction at such high temperatures is problematic due to high energy and equipment costs.

WO 2007/140479 describes formation of nanoparticles comprising a core having a largest dimension less than about 10 nm; and a metal layer substantially surrounding the core and having a largest dimension less than about 200 nm using solvents such as polyol, ethylene glycol, propylene glycol, 1,3-propanediol, and combinations thereof. According to this reference, the layer surrounding the core can comprise silver, gold palladium or platinum.

SUMMARY OF THE INVENTION

One aspect of some embodiments of the invention relates to multi-metallic nanoparticles with a core of a first metal (Me1) and a continuous shell of a second metal (Me2). In some exemplary embodiments of the invention, these nanoparticles are provided as populations. The term population as used throughout this specification and the accompanying claims refers to a large number of similar nanoparticles. Optionally, the population may be subject a degree of variation. Exemplary degrees of variation are described as numerical ranges throughout the specification. Typically, a population of nanoparticles employed in printing a pattern would include thousands, hundreds of thousands or millions of nanoparticles. The exact number of particles in a population varies with volume and concentration of the specific composition in question.

One aspect of some embodiments of the invention relates to populations of Me1 core/Me2 shell nanoparticles in the presence of a dispersion stabilizer with an adjustable charge.

Optionally, the population is provided as an aqueous dispersion. Optionally, the dispersion includes 1-80 wt % nanoparticles.

In some exemplary embodiments of the invention, the Me1 core/Me2 shell nanoparticles have an atomic ratio of $Me_1$ to $Me_2$ in the range of 0.005 to 2.

Optionally, Me2 is more costly than Me1. This creates a trade-off between increased protection of Me1 against oxidation offered by a thicker shell and a desire to keep production costs low. This tradeoff favors implementation of the thinnest shell that will provide the requisite degree of protection for the Me1 core.

In some exemplary embodiments of the invention, the population of Me1 core/Me2 shell nanoparticles is provided substantially free of Me1 nanoparticles and/or Me2 nanoparticles.

Optionally, the shell is characterized by an average thickness in the range of 0.5 to 10 nm.

Optionally, the Me1 core/Me2 shell nanoparticles are characterized by an average diameter in the range of 5 to 300 nm.

According to various exemplary embodiments of the invention Me1 and/or Me2 are provided as single metals or mixtures or alloys of two or more metals.

In some exemplary embodiments of the invention, dispersions of Me1 core/Me2 shell nanoparticles are used as inks. Optionally, patterns printed with such inks are sintered to increase their conductivity. Optionally, the inks are provided in an ink jet cartridge. In some exemplary embodiments of the invention, the inks are characterized by a viscosity of 10, 20, 30, 40, 50, 100 or 200 cPs (or intermediate viscosities) at exit from the ink jets.

An aspect of some embodiments of the invention relates to a kit including a volume of the population of Me1 core/Me2 shell nanoparticles together with a sufficient quantity of a reagent capable of reducing the zeta potential of the nanoparticles in the volume to less than |±15| mV in dispersion.

Optionally, the kit includes a flocculation reagent.

An aspect of some exemplary embodiments of the invention relates to a method of producing a conductive pattern from Me1 core/Me2 shell nanoparticles.

In some exemplary embodiments of the invention, the method includes applying the nanoparticles to a substrate to form a pattern and sintering at a temperature lower than 130° C.

In some exemplary embodiments of the invention, the method includes applying the nanoparticles to a substrate to form a pattern and reducing a net charge of an adjustable charge based stabilizer present in the population.

In some exemplary embodiments of the invention, the method includes applying the nanoparticles to a substrate to form a pattern and activating a flocculant provided in the population to induce flocculation.

Optionally, the substrate can be treated with flocculant on a portion of, or substantially its entire surface. Alternatively or additionally, flocculant can be applied to the patter in a post application process.

According to various exemplary embodiments of the invention patterns are applied to substrates including paper, ceramics, semiconductors, metals and plastics.

An aspect of some exemplary embodiments of the invention relates to a method of producing Me1 core/Me2 shell nanoparticles.

In some exemplary embodiments of the invention, nanoparticles of Me1 are provided an aqueous solution with at least some Me1 atoms in an oxidation state suitable to reduce ions of a second metal (Me2) and a salt of a second metal Me2 is introduced to the aqueous solution. According to these exemplary embodiments of the invention, essentially only Me1 atoms at a surface of the Me1 nanoparticles reduce Me2 ions. This reduction forms an $Me_2$ shell on the $Me_1$ nanoparticles to produce the Me1 core/Me2 shell nanoparticles.

Optionally, provision of the nanoparticles of Me1 involves chemically reducing a salt of the first metal ($Me_1$) in the aqueous solution by contacting with a reducing agent to produce the Me1 nanoparticles. The reducing agent can be removed after formation of the Me1 nanoparticles.

Optionally, a stabilizing agent is provided in the aqueous solution to reduce a tendency of the Me1 nanoparticles and/or the Me1 core/Me2 shell nanoparticles to aggregate and/or precipitate.

In some exemplary embodiments of the invention, $Me_1$ includes one or more of zinc, copper, nickel, cobalt and iron. Optionally, Me1 is provided as a nitrate, an acetate, a sulphate or a chloride salt or a combination thereof.

In some exemplary embodiments of the invention, Me2 includes one or more of silver, gold, palladium and platinum.

Optionally, $Me_2$ is provided as a nitrate, an acetate, a sulphate, a carbonate or an oxide or a combination thereof. In some exemplary embodiments of the invention, carbonate and/or oxide which are characterized by a relatively low solubility contribute to desired shell formation characteristics. Additional exemplary embodiments of the invention relate to multi-metallic nanoparticles produced by one or more methods as described hereinabove and/or hereinbelow.

One aspect of some exemplary embodiments of the invention relates to a printed pattern including a conductive layer comprising Me1 and Me2 arranged so that Me2 prevents oxidation of Me1 at temperatures up to 150 degrees centigrade. In some exemplary embodiments of the invention, the pattern is used in production of a flat display device and/or a solar cell and/or an electrode and/or an antenna and/or an electroluminescent device and/or a connector in a printed circuit and/or a defrosting element in a glass laminate.

In some exemplary embodiments of the invention, Me1 core/Me2 shell nanoparticles are flocculated after they are applied to form a printed pattern. As used in this specification and the accompanying claims "flocculation" refers formation of aggregates or flocs. Optionally, flocculation is a reversible process.

In other exemplary embodiments of the invention, Me1 core/Me2 shell nanoparticles are coagulated after they are applied to form a printed pattern. As used in this specification and the accompanying claims "coagulation" refers to an irreversible process.

In other exemplary embodiments of the invention, Me1 core/Me2 shell nanoparticles are coalesced after they are applied to form a printed pattern. As used in this specification and the accompanying claims "coalesced" refers to an irreversible process in which two or more particles are combined into a single particle (similar to sintering).

In some exemplary embodiments of the invention, there is provided a composition including a plurality of multi-metallic nanoparticles each consisting essentially of a core including at least one first metal (Me1) and a continuous shell that includes atoms of at least one second metal (Me2).

Optionally, the continuous shell of Me2 atoms protects the Me1 atoms from oxidation at all temperatures less than 150° C.

In some exemplary embodiments of the invention, there is provided a dispersion including: (a) a population of multi-metallic nanoparticles as described above; (b) a dispersion stabilizer; and (c) a liquid vehicle.

In some exemplary embodiments of the invention, there is provided a composition including: (a) a plurality of multi-metallic nanoparticles each consisting essentially of a core including at least one first metal (Me1) and a shell including atoms of at least one second metal (Me2); and (b) a dispersion stabilizer with an adjustable charge.

Optionally, the dispersion stabilizer includes a net negative charge.

Optionally, Carboxyl groups in the stabilizer contribute to the net negative charge.

Optionally, the dispersion stabilizer includes a net positive charge.

Optionally, amine groups in the stabilizer contribute to the net positive charge.

In some exemplary embodiments of the invention, there is provided a dispersion, the dispersion including a population of multi-metallic nanoparticles as described above and a liquid vehicle.

Optionally, the population is substantially free of Me2 nanoparticles.

Optionally, the dispersion stabilizer is capable of enabling flocculation under certain conditions.

Optionally, the shell is characterized by an average thickness in the range of 0.5 to 10 nm.

Optionally, the multi-metallic nanoparticles are characterized by an average diameter in the range of 5 to 300 nm.

Optionally, the dispersion is characterized by a concentration of the multi-metallic nanoparticles in the liquid vehicle in the range 1-80 wt %.

Optionally, the liquid vehicle is an aqueous vehicle.

Optionally, the population is characterized by an atomic ratio of the $Me_1$ to the $Me_2$ in the range of 0.005 to 2.

Optionally, the composition is provided as an ink composition including a dispersion characterized by a viscosity not exceeding 200 cPs at room temperature, optionally not exceeding 15 cPs at room temperature.

In some exemplary embodiments of the invention, there is provided an ink jet cartridge. The cartridge includes: (a) a reservoir containing a volume of a dispersion of multi-metallic nanoparticles as described hereinabove; (b) a plurality of ink jets; and (c) an interface to a printer.

Optionally, the ink-jets and the interface are each independently adapted for bubble jet printing.

Optionally, the ink-jets and the interface are each independently adapted for piezo-electric printing.

Optionally, the dispersion is characterized by a viscosity not exceeding 10 cPs at room temperature.

In some exemplary embodiments of the invention, there is provided a kit. The kit includes:

(a) an amount of the population of multi-metallic nanoparticles as described hereinabove; and (b) a sufficient quantity of a reagent capable of reducing a zeta potential of the multi-metallic nanoparticles to less than |±15| mV in dispersion.

Optionally, the kit includes a sufficient quantity of a liquid vehicle to suspend the amount to form a dispersion of 1-80 wt %.

Optionally, the liquid vehicle is provided as an aqueous vehicle.

Optionally, the amount is provided as a dispersion in a liquid vehicle.

Optionally, the kit includes a sufficient quantity of a flocculant to cause a desired degree of flocculation of a dispersion including the nanoparticles.

Optionally, the flocculant is provided as a separate reagent.

Optionally, the flocculant is provided as part of the dispersion.

In some exemplary embodiments of the invention, there is provided a method of producing a conductive pattern. The method includes: (a) applying a population of multi-metallic nanoparticles as described hereinabove to a substrate to form a pattern; and (b) sintering the nanoparticles at a temperature lower than 130° C.

In some exemplary embodiments of the invention, there is provided a method of producing a conductive pattern. The method includes: (a) applying a population of multi-metallic nanoparticles as described hereinabove to a substrate to form a pattern; and (b) reducing a net charge of the charge based stabilizer.

In some exemplary embodiments of the invention, there is provided a method of producing a conductive pattern. The method includes: (a) applying a population of multi-metallic nanoparticles as described hereinabove to a substrate to form a pattern; and (b) activating a flocculant provided in the population to induce flocculation.

Optionally, the method includes pre-treating the substrate with a flocculant.

Optionally, the pre-treating is carried out on substantially all of a surface of the substrate.

Optionally, the pre-treating is carried out only in a desired region.

Optionally, the method includes applying a flocculant to the pattern.

Optionally, the substrate includes at least one member of the group consisting of paper, a ceramic, a semiconductor, a metal, a semiconductor and a plastic.

In some exemplary embodiments of the invention, there is provided a method for producing multi-metallic nanoparticles. The method includes: (a) providing nanoparticles of a first metal ($Me_1$) in an aqueous solution, wherein at least a portion of the Me1 atoms are in an oxidation state suitable to reduce atoms of a second metal (Me2); and (b) introducing a salt of a second metal Me2 to the aqueous solution; whereby essentially only Me1 atoms at a surface of the Me1 nanoparticles reduce Me2 ions to form an $Me_2$ shell on the $Me_1$ nanoparticles to produce the multi-metallic nanoparticles.

Optionally, the providing includes chemically reducing Me1 ions of an Me1 salt in the aqueous solution by contacting with a reducing agent to produce the Me1 nanoparticles.

Optionally, the method includes removing the reducing agent.

Optionally, the removing includes at least one of physical removal and inactivation.

Optionally, the Me1 ions are reduced at a temperature not exceeding 100 degrees centigrade, optionally not exceeding 50 degrees centigrade, optionally not exceeding 25 degrees centigrade.

Optionally, the method includes providing a stabilizing agent in the first aqueous solution.

Optionally, the $Me_1$ salt includes at least one metal selected from the group consisting of: zinc, copper, nickel, cobalt and iron.

Optionally, the $Me_1$ salt consists of a copper salt.

Optionally, the salt of $Me_1$ is selected from the group consisting of a nitrate, an acetate, a sulphate and a chloride.

Optionally, the reducing agent has a reduction potential lower than 0 V.

Optionally, the reducing agent includes at least one member of the group consisting of hydrazine hydrate, sodium borohydride, sodium formaldehydesulfoxilate (Rongalite), ascorbic acid and sodium ascorbate.

Optionally, the reducing agent consists essentially of formaldehydesulfoxilate (Rongalite).

Optionally, the $Me_1$ concentration is in the range of 0.01-3.15 Molar.

Optionally, the stabilizing agent includes at least one member of the group consisting of a soluble polymer and a surfactant.

Optionally, the water soluble polymer is a polyelectrolyte.

Optionally, the polyelectrolyte includes at least one member of the group consisting of polyacrylic acid, polyacrylic acid sodium salt, polycarboxylatethers, polyimine, polydiallyldimethyl ammonium chloride, polyvinylpirrolidone, proteins and polypyrrol, polysaccharides.

Optionally, the stabilizing agent has carboxylic groups.

Optionally, a ratio of the stabilizing agent to $Me_1$ by weight is in the range of 0.01 to 2.

Optionally, the $Me_2$ salt includes at least one metal selected from the group consisting of silver, gold, palladium and platinum.

Optionally, the $Me_2$ salt is selected from the group consisting of a nitrate, an acetate a sulphate a carbonate and an oxide.

Optionally, the $Me_2$ salt is silver nitrate.

Optionally, an atomic ratio of $Me_2:Me_1$ is in the range of 0.005 to 2.

Optionally, a diameter of the $Me_1$ nanoparticles is in the range of 5 to 300 nm.

Optionally, a diameter of the $Me_1$ nanoparticles is in the range of 30 to 200 nm.

Optionally, a diameter of the $Me_1$ nanoparticles is in the range of 50 to 150 nm.

In some exemplary embodiments of the invention, there is provided a printed pattern. The pattern includes a multi-metallic conductive layer includes a first metal (Me1) and a second metal (Me2) arranged so that Me2 prevents oxidation of Me1 at all temperatures less than 150 degrees centigrade.

Optionally, an atomic ratio of $Me_2:Me_1$ is in the range of 0.005 to 2.

Optionally, a thickness of the $Me_1$ is in the range of 5 to 500 nm.

Optionally, the Me2 is characterized by an average thickness in the range of 0.5 to 10 nm.

Optionally, the printed pattern is provided in the form an item selected from the group consisting of a flat display device, a solar cell, an electrode, an antenna, an electroluminescent device, a connector in a printed circuit and a defrosting element in a glass laminate.

Optionally, $Me_1$ includes at least one metal selected from the group consisting of: zinc, copper, nickel, cobalt and iron.

Optionally, $Me_2$ includes at least one metal selected from the group consisting of: silver, gold, palladium and platinum.

In some exemplary embodiments of the invention, there are provided multi-metallic nanoparticles produced by one or more methods described hereinabove and/or hereinbelow.

In some exemplary embodiments of the invention, there is provided a nanoparticle comprising: a core comprising at least one first metal (Me1) and a continuous shell comprising atoms of at least one second metal (Me2).

In some exemplary embodiments of the invention, there is provided a nanoparticle comprising a core comprising at least one first metal (Me1) and a shell of atoms of at least one second metal (Me2) which protects said core from oxidation at all temperatures less than 150° C.

Optionally, the nanoparticles are provided as a population substantially free of Me2 nanoparticles.

Unless otherwise defined, all technical and scientific terms used herein have the same meaning as commonly understood by one of ordinary skill in the art to which this invention belongs. Although suitable methods and materials are described below, methods and materials similar or equivalent to those described herein can be used in the practice of the present invention. In case of conflict, the patent specification, including definitions, will control. All materials, methods, and examples are illustrative only and are not intended to be limiting.

As used herein, the terms "comprising" and "including" or grammatical variants thereof are to be taken as specifying inclusion of the stated features, integers, actions or components without precluding the addition of one or more additional features, integers, actions, components or groups thereof. This term is broader than, and includes the terms "consisting of" and "consisting essentially of" as defined by the Manual of Patent Examination Procedure of the United States Patent and Trademark Office.

The phrases "consisting essentially of" and "using essentially only" or grammatical variants thereof when used herein are to be taken as specifying the stated features, integers, steps, ingredients or components but do not preclude the addition of one or more additional features, integers, steps, ingredients components or groups thereof but only if the additional features, integers, steps, ingredients, components or groups thereof do not materially alter the basic and novel characteristics of the claimed composition, device or method.

The phrase "each consisting essentially of" indicates that the population is characterized by a high degree of homogeneity. According to various exemplary embodiments of the invention the degree of homogeneity can be 80, 85, 90, 95, 97.5, 99 or substantially 100% or intermediate percentages.

The term "method" refers to manners, means, techniques and procedures for accomplishing a given task including, but not limited to, those manners, means, techniques and procedures either known to, or readily developed from known manners, means, techniques and procedures by practitioners of architecture and/or computer science.

Concentrations are expressed as weight percentage (wt %) unless otherwise indicated

BRIEF DESCRIPTION OF THE DRAWINGS

In order to understand the invention and to see how it may be carried out in practice, embodiments will now be described, by way of non-limiting example only, with reference to the accompanying figures. In the figures, identical and similar structures, elements or parts thereof that appear in more than one figure are generally labeled with the same or similar references in the figures in which they appear. Dimensions of components and features shown in the figures are chosen primarily for convenience and clarity of presentation and are not necessarily to scale. The attached figures are.

DETAILED DESCRIPTION OF EMBODIMENTS

Embodiments of the invention relate to populations of multi-metallic nanoparticles, aqueous dispersions of such populations, inks containing such populations and/or dispersions, ink cartridges loaded with such inks, kits for preparation of dispersions and/or populations, methods for making such populations, methods of printing patterns using such dispersions and methods of rendering the patterns conductive, for example by sintering.

Specifically, some embodiments of the invention can be used to produce flat display devices, solar cells, electrodes, antennae, electroluminescent devices, connectors in a printed circuit and defrosting elements in glass laminates.

The principles and operation of multi-metallic nanoparticles and/or methods of their production and/or pattern formation using them according to exemplary embodiments of the invention may be better understood with reference to the drawings and accompanying descriptions.

Before explaining at least one embodiment of the invention in detail, it is to be understood that the invention is not limited in its application to the details set forth in the following description or exemplified by the Examples. The invention is capable of other embodiments or of being practiced or carried out in various ways. Also, it is to be understood that the phraseology and terminology employed herein is for the purpose of description and should not be regarded as limiting.

Exemplary Method of Producing Multi-Metallic Nanoparticles

Figure 1A:
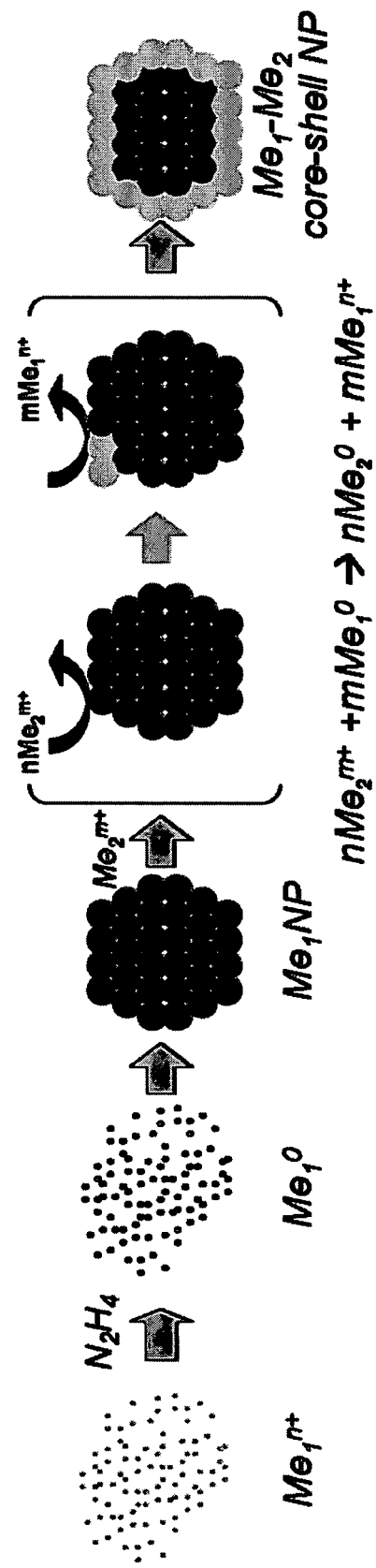
FIG. 1A is a schematic illustration of synthesis of a single oxidizable ($Me_1$) nanoparticle and the formation of a protecting ($Me_2$) shell with the surface $Me_1$ atoms serving as reducing agents for the $Me_2$ ions.

FIG. 1A is a schematic illustration of stepwise synthesis of a nanoparticle of one or more first metals (Me1) which are followed by formation of a protective shell of one or more second metals ($Me_2$).

From left to right, FIG. 1A depicts provision of Me1 atoms in an oxidation sate n+ followed by reduction to an oxidation state of 0 by a reducing agent ($N_2H_4$ in the figure although different reducing agents are used in different embodiments of the invention) to produce nanoparticles of Me1.

At this stage, the reducing agent can be removed and a plurality of n Me2 atoms are added, each characterized by an oxidation state of m+. Interaction between Me1 atoms on the surface of the Me1 nanoparticle and Me2 atoms brought into contact therewith, in the absence of an external reducing agent, causes some of the Me2 atoms to be reduced to 0 oxidation sate, with a corresponding oxidation of some Me1 atoms to the n+ oxidation state. As depicted on the right, the end result is formation of an Me2 shell on the Me1 nanoparticle which serves as a core. In some exemplary embodiments of the invention, conducting this procedure in the absence of any reducing agent other than Me1, reduces the possibility that Me2 nanoparticles will form and/or reduces the possibility that some Me1 nanoparticles will remain uncoated. As will be demonstrated in examples hereinbelow, the Me2 shell protects the Me1 core from subsequent oxidation, even at elevated temperatures.

Figure 1B:
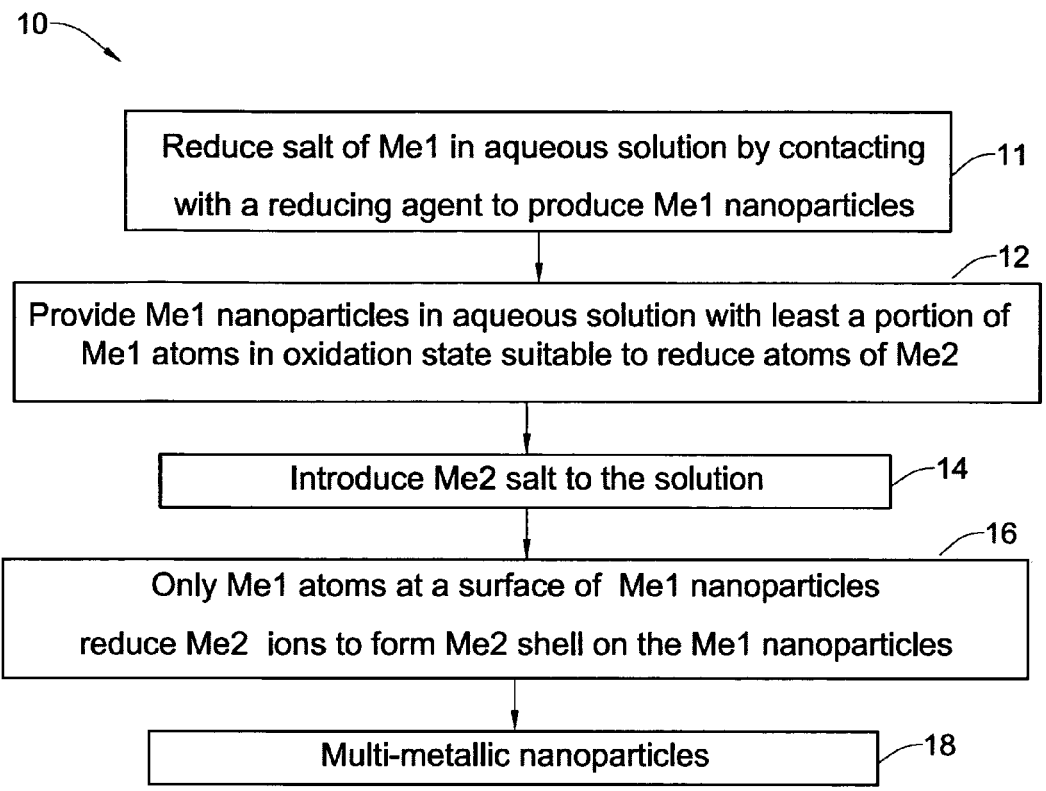
FIG. 1B is a simplified flow diagram illustrating a method for production of multi-metallic nanoparticles according to some exemplary embodiments of the invention.

FIG. 1B depicts an exemplary method 10 for producing multi-metallic nanoparticles. Depicted method 10 includes providing 12 nanoparticles of a first metal ($Me_1$) in an aqueous solution. As explained above, at least a portion of the Me1 atoms are in an oxidation state suitable to reduce atoms of a second metal (Me2). A salt of Me2 is introduced 14 to the aqueous solution. Since no other reducing agent is present, essentially only Me1 atoms at a surface of the Me1 nanoparticles reduce 16 Me2 ions to form an $Me_2$ shell on the $Me_1$ nanoparticles to produce the multi-metallic nanoparticles 18.

Optionally, providing 12 includes reducing 11 a salt of the first metal ($Me_1$) in the aqueous solution by contacting with a reducing agent to produce the Me1 nanoparticles.

In some exemplary embodiments of the invention, the method includes removing the reducing agent from the aqueous solution after formation of the Me1 nanoparticles. Optionally, removing can be via physical removal and/or inactivation.

According to various exemplary embodiments of the invention removing includes one or more processes such as centrifugation, decantation, filtration and ultrafiltration and/or addition of an oxidizing agent (e.g. acetaldehyde). Optionally, removal is followed by re dispersion in an aqueous solution. Optionally, re-dispersion can be used to adjust nanoparticle concentration to a desired level.

In some exemplary embodiments of the invention, the Me1 ions are reduced 11 (FIG. 1B) at a temperature not exceeding 100, optionally 50, optionally 25 degrees centigrade or intermediate temperatures.

In some exemplary embodiments of the invention, a stabilizing agent is present in the aqueous solution. Optionally, the stabilizing agent reduces a tendency of the nanoparticles to aggregate.

According to various exemplary embodiments of the invention $Me_1$ includes one or more of zinc, copper, nickel, cobalt and iron. Optionally, Me1 can be provided as a salt such as a nitrate, an acetate, a sulphate and a chloride. In some exemplary embodiments of the invention, copper serves as Me1.

According to various exemplary embodiments of the invention $Me_2$ includes at least one of: silver, gold, palladium and platinum. In some exemplary embodiments of the invention, Me2 is silver. Optionally, Me2 is provided as a salt such as an acetate a sulphate a carbonate or an oxide. In some exemplary embodiments of the invention, Me2 is provided as silver nitrate.

In some exemplary embodiments of the invention, the reducing agent employed to reduce the Me1 atoms has a reduction potential lower than 0 V. Optionally, the reducing agent includes at least one of: hydrazine hydrate, sodium borohydride, sodium formaldehydesulfoxilate (Rongalite), ascorbic acid and sodium ascorbate. In some exemplary embodiments of the invention, the reducing agent consists essentially of formaldehydesulfoxilate (Rongalite). Rongalite is suitable for use in aqueous solutions.

In some exemplary embodiments of the invention, the $Me_1$ concentration is in the range of 0.01-3.15 Molar. Optionally, reducing the Me1 concentration makes control of Me1 nanoparticle size distribution easier and/or contributes to greater size uniformity. In some exemplary embodiments of the invention, an atomic ratio of Me2:Me1 is in the range of 0.005 to 2. Optionally, the atomic ratio contributes to shell thickness. In some exemplary embodiments of the invention, increasing a relative amount of Me2 contributes to increased shell thickness. Alternatively or additionally, Me1 core diameter can contribute to shell thickness.

According to various exemplary embodiments of the invention different types of stabilizing agents are employed. Optionally, the stabilizing agent includes a soluble polymer and/or a surfactant. These types of stabilizing agents are well suited to use in aqueous solution.

Suitable water soluble polymers include, but are not limited to, polyelectrolytes such as, for example one or more of polyacrylic acid, polyacrylic acid sodium salt, polycarboxylatethers, polyimine, polydiallyldimethyl ammonium chloride, polyvinylpirrolidone, proteins and polypyrrol, polysaccharides.

In some exemplary embodiments of the invention, the stabilizing agent has carboxylic groups.

Optionally, a ratio of the stabilizing agent to $Me_1$ by weight is in the range of 0.01 to 2. In some exemplary embodiments of the invention, an increase in stabilizer concentration contributes to a decrease in particle size.

In some exemplary embodiments of the invention, the $Me_1$ nanoparticles are characterized by a diameter in the range of 5 to 300 nm, optionally 30 to 200 nm, optionally 50 to 150 nm.

Some exemplary embodiments of the invention, relate to multi-metallic nanoparticles produced by methods disclosed herein.

Exemplary Methods of Producing a Conductive Pattern

In some exemplary embodiments of the invention, Me1 core/Me2 shell multi-metallic nanoparticles can be advantageously employed to produce conductive patterns.

Figure 1C:
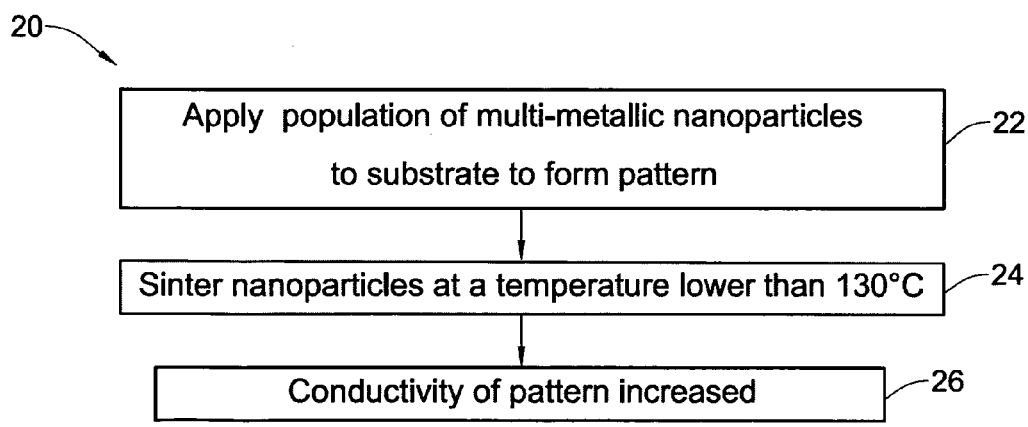
FIG. 1C is a simplified flow diagram illustrating a method for production of conductive patterns according to some exemplary embodiments of the invention.

FIG. 1C is a simplified flow diagram illustrating an exemplary method 20 for production of conductive patterns according to some embodiments of the invention.

Depicted exemplary method 20 includes applying 22 a population of multi-metallic nanoparticles as described hereinabove and hereinbelow to a substrate to form a pattern and sintering 24 the nanoparticles at a temperature lower than 130° C. so that conductivity is increased 26.

Figure 1D:
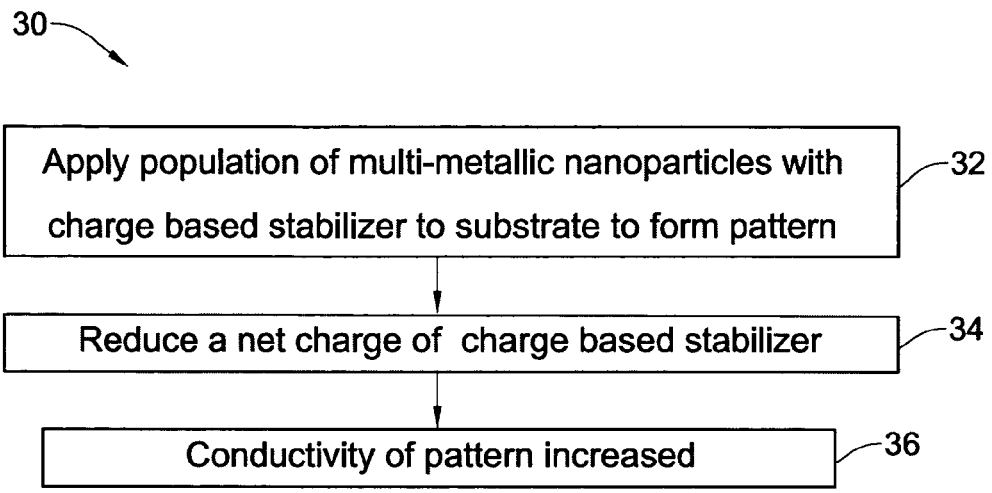
FIG. 1D is a simplified flow diagram illustrating another method for production of conductive patterns according to some exemplary embodiments of the invention.

FIG. 1D is a simplified flow diagram illustrating another exemplary method 30 for production of conductive patterns according to some embodiments of the invention.

Depicted exemplary method 30 includes applying 32 a population of multi-metallic nanoparticles as described hereinabove and hereinbelow including an adjustable charge based stabilizer to a substrate to form a pattern and reducing 34 a net charge of the charge based stabilizer so that conductivity is increased 36.

Figure 1E:
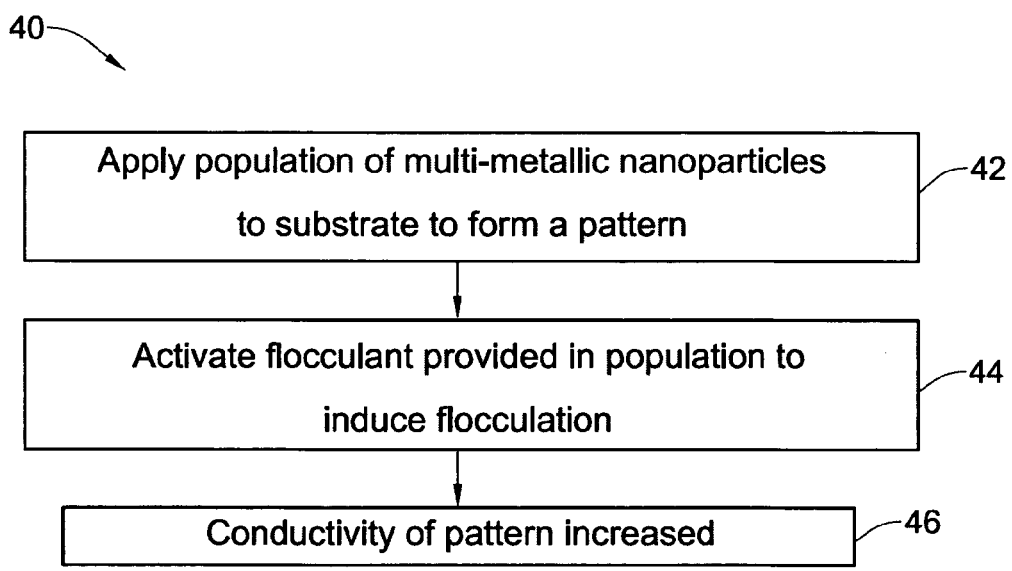
FIG. 1E is a simplified flow diagram illustrating still another method for production of conductive patterns according to some exemplary embodiments of the invention.

FIG. 1E is a simplified flow diagram illustrating still another exemplary method 40 for production of conductive patterns according to some embodiments of the invention.

Depicted exemplary method 40 includes applying 42 a population of multi-metallic nanoparticles as described hereinabove and hereinbelow to a substrate to form a pattern and activating 44 a flocculant provided in the population to induce flocculation so that conductivity of the pattern is increased 46.

According to various exemplary embodiments of the invention substrates upon which a conductive pattern is to be applied (e.g. printed), are pre-treated with a flocculant. Optionally, the pre-treating is carried out on substantially all of a surface of the substrate. "Substantially all" in this case means that some portions may be masked or shielded by machinery which holds the substrate during pretreatment. Optionally, the pre-treating is carried out only in a desired region.

In some exemplary embodiments of the invention, flocculant is applied to the pattern in a post application (i.e. after printing) process.

Exemplary Multi-Metallic Nanoparticles

Figure 1F:
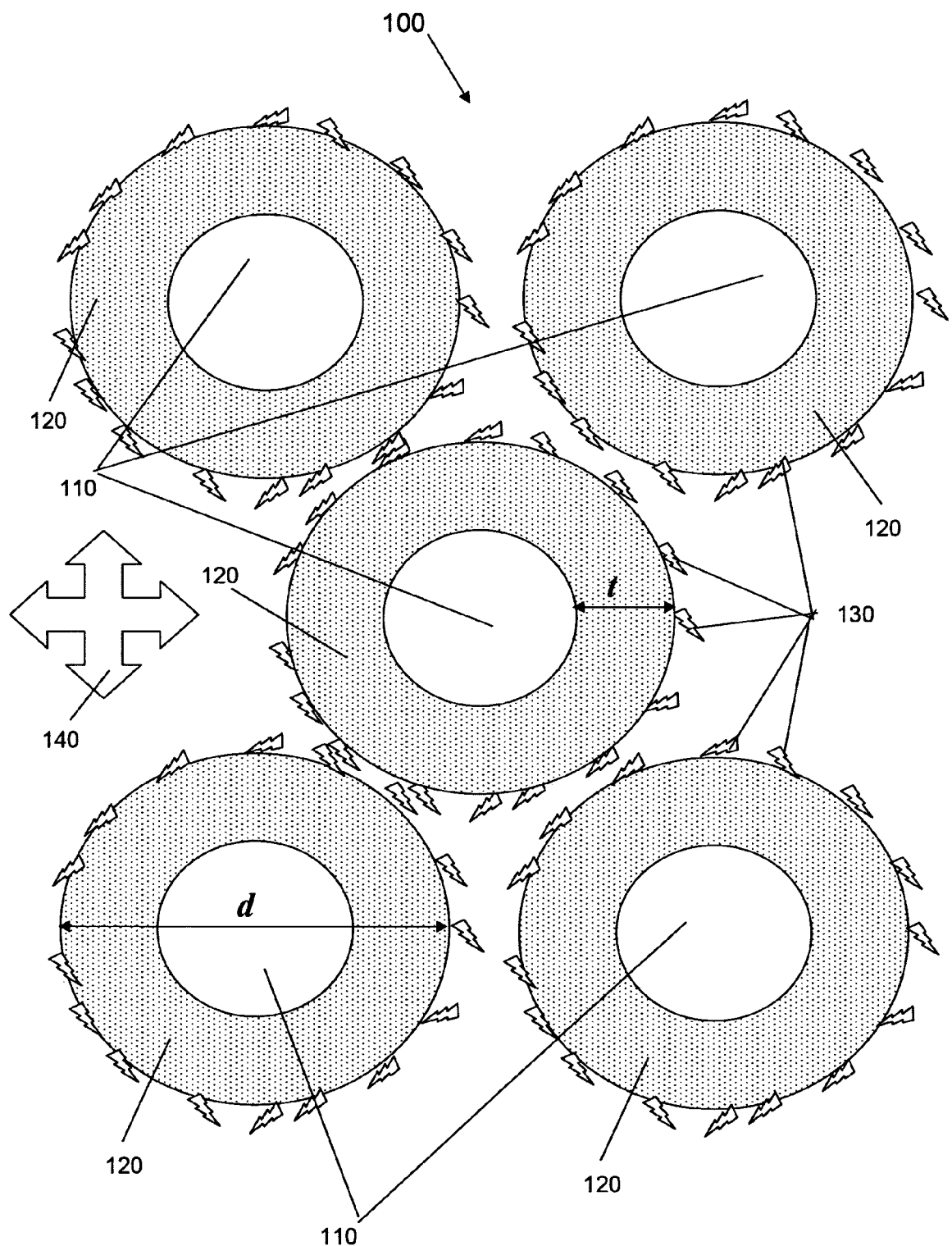
FIG. 1F is a schematic representation of a population of multi-metallic nanoparticles according to some exemplary embodiments of the invention.

FIG. 1F is a schematic representation of a population 100 of multi-metallic nanoparticles including a plurality of multi-metallic nanoparticles (five are depicted for clarity although a much larger number would typically be present) each consisting essentially of a core 110 comprising at least one first metal (Me1) and a continuous shell 120 comprising atoms of at least one second metal (Me2). The term continuous as used in this specification and the accompanying claims indicates that the shell is formed by attachment of individual Me2 atoms to a surface of the Me1 nanoparticle. In some exemplary embodiments of the invention, the continuous shell of Me2 atoms protects the Me1 atoms from oxidation at all temperatures less than 150° C., optionally all temperatures less than 180° C.

Optionally, population 100 is provided in an aqueous dispersion including a dispersion stabilizer 130 (indicated as lightning bolts) and an aqueous vehicle 140 (indicated as 4 headed arrow).

Referring again to FIG. 1F, population 100 of multi-metallic nanoparticles can also be described as a plurality of multi-metallic nanoparticles each consisting essentially of a core 110 comprising at least one first metal (Me1) and a shell 120 comprising atoms of at least one second metal (Me2) and an adjustable charge based dispersion stabilizer 130. In some exemplary embodiments of the invention, the adjustable charge based dispersion stabilizer 130 comprises a net negative charge. Optionally, Carboxyl groups in stabilizer 130 contribute to the net negative charge. In other exemplary embodiments of the invention, the adjustable charge based dispersion stabilizer 130 comprises a net positive charge. Optionally, amine groups in stabilizer 130 contribute to the net positive charge.

Optionally, population 100 is provided as a dispersion in an aqueous vehicle 140. In some exemplary embodiments of the invention, population 100 is substantially free of Me2 nanoparticles.

In some exemplary embodiments of the invention, dispersion stabilizer 130 is capable of switching to a non-stabilizing form under certain conditions. Optionally, the switching enables flocculation. For example, in some exemplary embodiments of the invention, exposure of carboxylic groups in the stabilizer to an acid vapor contributes to flocculation of the nanoparticles.

In some exemplary embodiments of the invention, the shell is characterized by an average thickness (indicated a "t'''" in FIG. 1F) in the range of 0.5 to 10 nm.

Optionally, the multi-metallic nanoparticles are characterized by an average diameter (indicated a "d''''" in FIG. 1F) in the range of 5 to 300 nm.

Alternatively or additionally, optionally, the multi-metallic nanoparticles are characterized by an atomic ratio of the $Me_1$ to the $Me_2$ in the range of 0.005 to 2.

Exemplary Aqueous Dispersions

In some exemplary embodiments of the invention, population 100 is provided as a dispersion with a concentration of the multi-metallic nanoparticles in the range 1-80 wt %. Optionally, the dispersion is provided in aqueous vehicle 140.

Exemplary Inks

Optionally, a dispersion as described hereinabove and/or exemplified hereinbelow is provided as an ink composition with a viscosity of 200 cPs or less, optionally 15 cPs or less at room temperature.

Exemplary Ink Cartridges

Figure 1G:
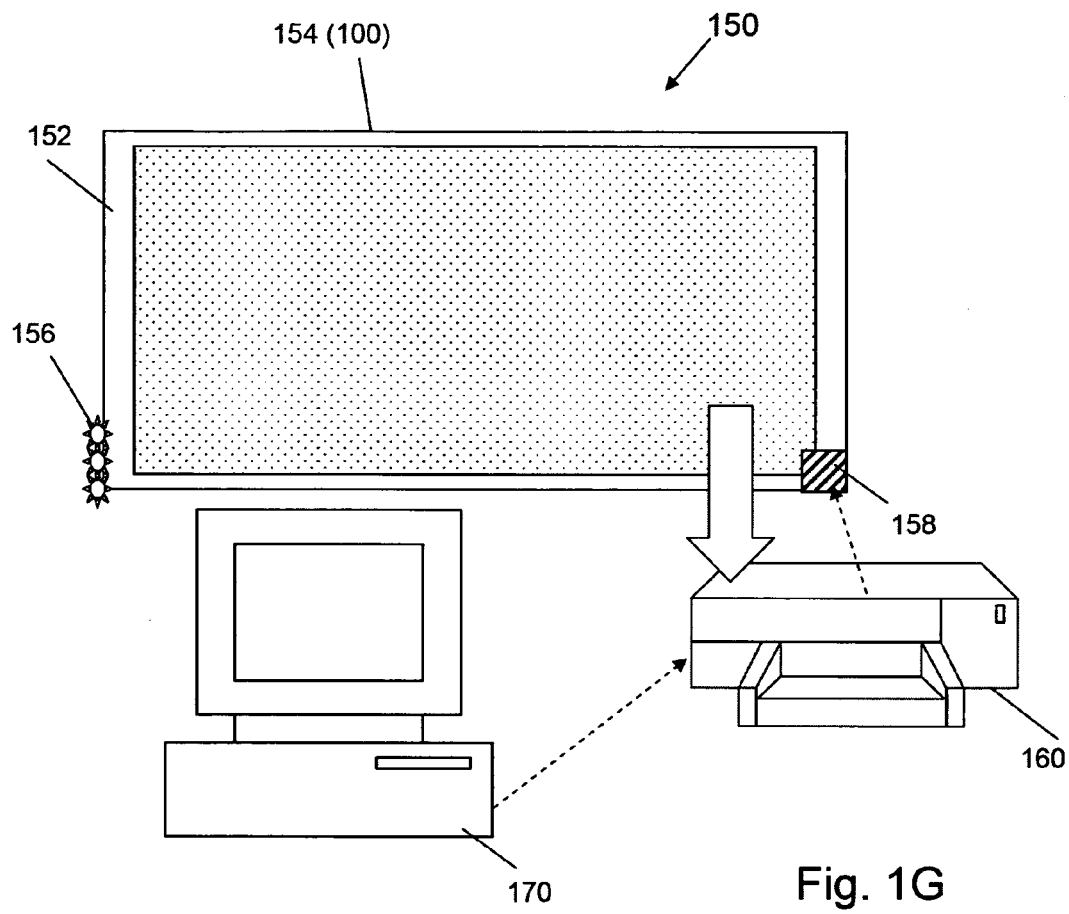
FIG. 1G is a schematic representation of an ink jet cartridge according to some exemplary embodiments of the invention.

FIG. 1G is a schematic representation of an ink jet cartridge 150 according to some exemplary embodiments of the invention. Depicted exemplary cartridge 150 includes a reservoir 154, defined within housing 152, containing a volume of a dispersion 154 of population 100 as well as a plurality of ink jets 156 and an interface 158 to a printer 160. During use, cartridge 150 is typically installed (wide downwards arrow) in printer 160 as is known in the art. Printer 160 then provides instructions (dotted arrow) via interface 158 which result in application of a desired pattern to a substrate via inkjets 156. Typically, the instructions originate in a computer 170 (dotted arrow).

Optionally, ink-jets 156 and/or interface 158 are adapted for bubble jet printing.

Optionally, ink-jets 156 and/or interface 158 are adapted for piezo-electric printing.

Optionally, the dispersion of population 100 is characterized by a viscosity not exceeding 10 cPs at room temperature.

Exemplary Kits

Figure 1H:
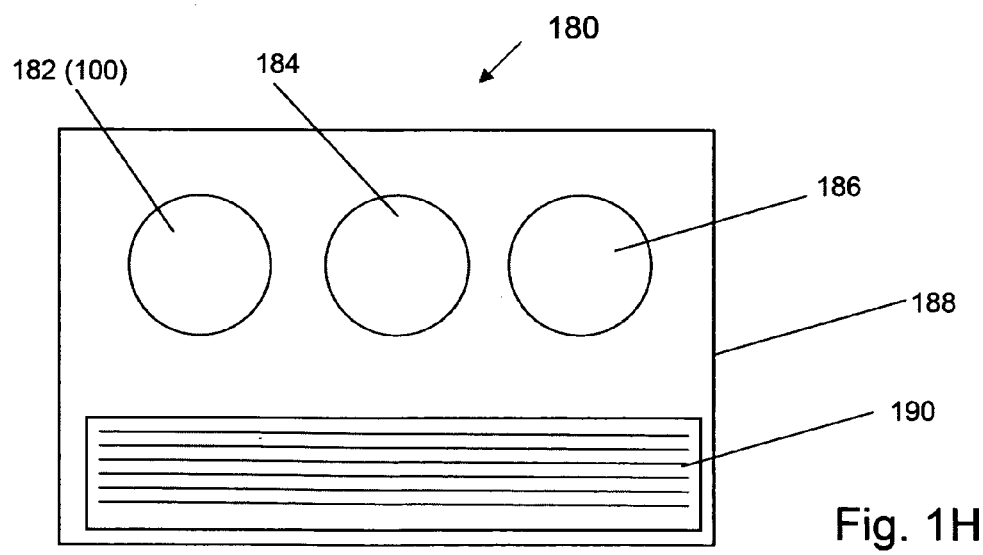
FIG. 1H is a schematic representation of a kit according to some exemplary embodiments of the invention.

FIG. 1H is a schematic representation of an exemplary kit 180 according to some exemplary embodiments of the invention. Depicted exemplary kit includes a volume 182 (depicted as a vial) of population 100 of multi-metallic nanoparticles as described hereinabove. Optionally, volume 100 is provided as a dry powder or as a dispersion in an aqueous solution. Depicted kit 184 includes a sufficient quantity 184 (depicted as a second vial) of a reagent capable of reducing the zeta-potential of the multi-metallic nanoparticles to less than |±15| mV in dispersion. Optionally, the kit includes a sufficient quantity 186 (depicted as a third vial) of a liquid vehicle to suspend the portion to form a dispersion of 1-80 wt %.

Optionally, liquid vehicle 186 is provided as an aqueous vehicle.

Optionally, volume 182 is provided as a dispersion in a liquid vehicle.

Optionally, kit 180 includes a sufficient quantity of a flocculant to cause a desired degree of flocculation of a dispersion comprising the nanoparticles (can be provided in vial 182 and/or 183). Optionally, the flocculant is provided as a separate reagent (e.g. in vial 186) or as part of the dispersion (e.g. in vial 182).

Exemplary Printed Patterns

Figure 9A:
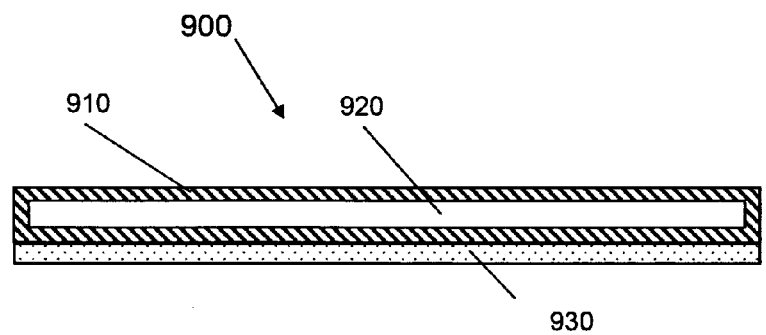
FIGS. 9A and 9B are schematic representations of a theoretical structure of a conductive pattern formed by sintering or coagulating or flocculating multi-metallic nanoparticles according to an exemplary embodiment of the invention.
Figure 9B:
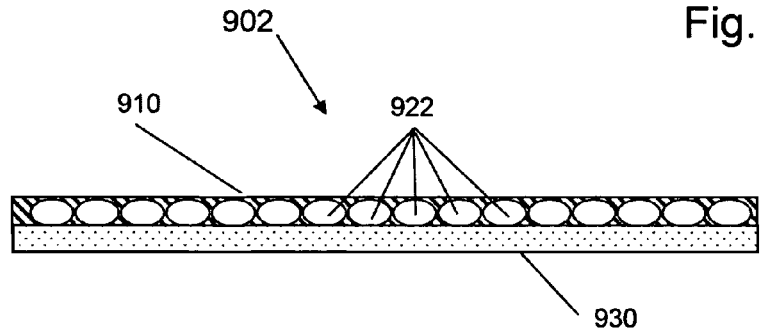

FIGS. 9A and 9B are schematic representations of theoretical structures (900 and 902 respectively) of a conductive pattern formed by sintering or coagulating or flocculating multi-metallic nanoparticles printed on a substrate according to exemplary embodiments of the invention. Each figure is presented as a transverse cross section.

In the figures, printed pattern 900 or 902 is a multi-metallic conductive layer including Me1 920 or 922 and Me2 910 arranged so that Me2 prevents oxidation of Me1 at all temperatures less than 150 degrees centigrade. Optionally, an atomic ratio of $Me_2:Me_1$ is in the range of 0.005 to 2. Optionally, a thickness of the $Me_1$ is in the range of 5 to 500 nm.

Optionally, the Me2 is characterized by an average thickness in the range of 0.5 to 10 nm.

According to various exemplary embodiments of the invention the printed pattern can be provided in many forms including but not limited to a flat display device, a solar cell, an electrode, an antenna, an electroluminescent device, a connector in a printed circuit and a defrosting element in a glass laminate.

$Me_1$ and $Me_2$ are each as described hereinabove and hereinbelow.

FIG. 9A depicts Me1 920 as a continuous layer and FIG. 9B depicts Me1 922 as retaining their "core-like" appearance. Each of these depictions is theoretical and either can serve to explain that the conductive and/or resistive properties of the printed pattern result from interaction between Me2 910 and Me1 920 and/or 922. Alternatively or additionally, either depiction can serve to explain how Me2 protects Me1 from oxidation.

Exemplary Reduction Conditions

According to some exemplary embodiments of the invention the Me1 ions are reduced to form Me1 nanoparticles at a temperature in the range of 20 to 100° C., optionally 20 to 50° C.

According to various exemplary embodiments of the invention the Me1 ions reduction process occurs in 1 to 100 minutes, optionally 1 to about 30 minutes.

According to some exemplary embodiments of the invention Me1 atoms on the surface of Me1 nanoparticles reduce Me2 ions at a temperature in the range of 1 to 100° C., optionally 1 to 30° C.

According to various exemplary embodiments of the invention the Me2 ions reduction process occurs in 1 to 100 minutes, optionally 1 to about 30 minutes.

Exemplary Additives

Optionally, populations of multi-metallic nanoparticles according to various embodiments of the invention include one or more additives such as humectants, binders, surfactants, fungicides, rheology modifiers, pH adjusting agents, co-solvents, and mixtures thereof.

Exemplary Reduction Potential Considerations

According to some exemplary embodiments of the invention the $Me_1$ atoms on the surface of the Me1 nanoparticles have a reduction potential of less than 0.4V, optionally less than 0.6 V. Optionally, increasing the reduction potential makes reduction of the Me2 ions more difficult.

Alternatively or additionally, according to some exemplary embodiments of the invention $Me_2$ is characterized by a reduction potential higher than 0.4V, optionally higher than 0.7V. In this case, reducing the reduction potential makes reduction, and consequently shell formation, more difficult.

Exemplary Use of Stabilizing Agents

In some exemplary embodiments of the invention, stabilizing agents contribute to a tendency of nanoparticles to remain in suspension. Optionally, a ratio of the stabilizing agent to $Me_1$ by weight is in the range of 0.01 to 2. Providing a lower amount of stabilizing agent reduces an amount of organic material on the Me1 nanoparticles and/or Me1-Me2 multi-metallic nanoparticles. Optionally, providing a higher amount of contributes to a reduction in aggregation and/or to a reduction in Me1 particle size.

Exemplary Adjustable Charge Based Stabilizing Agents

In some exemplary embodiments of the invention, reduction of a net charge of a charge based adjustable stabilizing agent causes aggregation or sintering without heating. Optionally, this sintering, contributes to conductivity of a sintered layer. Optionally, reducing the zeta potential of the multi-metallic nanoparticles below about |±15| mV in dispersion contributes to sintering.

In some exemplary embodiments of the invention, a reversible stabilizer is provided with a negative net charge. Optionally, the negative net charge results, at least in part, from the presence of one or more carboxylic groups. In some exemplary embodiments of the invention, after printing acid vapors are applied to the printed pattern to reduce the negative net charge. Optionally, reduction in negative net charge contributes to flocculation.

Exemplary Physical Dispersion Means

According to some exemplary embodiments of the invention physical dispersal is used instead of or in addition to chemical or electrochemical dispersants. Optionally, sonication of the population of nanoparticles contributes to dispersal of the Me1 nanoparticles and/or the Me1-Me2 multi-metallic nanoparticles.

Exemplary Flocculants

In some exemplary embodiments of the invention, one or more flocculants is/are provided separate from the dispersion or the ink, and comes into contact with the metallic particles only during or after printing.

In other exemplary embodiments of the invention, one or more flocculants is present in the dispersion, but is inactive as a flocculant while it is in the dispersion. After application to the substrate (for example by printing), a change can activate the flocculant. Optionally, these inactive flocculants are provided as reversible stabilizing agents.

According to various exemplary embodiments of the invention, changes which can cause activation of the flocculant include, but are not limited to, changes in ionic concentration (e.g. due to water evaporation), changes in net charge (e.g. due to exposure to acid or amine vapors).

In some exemplary embodiments of the invention, one or more electrolytes which can cause aggregation above a critical concentration, is provided below the critical concentration. After printing, the liquid vehicle evaporates and the electrolyte reaches the critical concentration and flocculation occurs.

Exemplary Considerations in Ink Formulation

In some exemplary embodiments of the invention, dispersions are provided as an ink adapted for ink jet printing. Adaptation can include controlling particle size to pass easily through ink jet nozzles of a relevant printer type and/or formulating to achieve a viscosity suitable for a specific printer type.

Exemplary Sintering Conditions

According to various exemplary embodiments of the sintering of the multi-metallic nanoparticles occurs at temperatures of 100, 90, 80, 70, 60, 50, 40, 30, 20 or 15 degrees C. or intermediate temperatures.

In some exemplary embodiments of the invention, chemical sintering is employed. For a chemical sintering reaction, the temperature at which the reaction will proceed is determined by the chemicals involved. Optionally, HCl employed as a chemical sintering agent can be effectively employed as low as −27 degrees C.

Optionally, sintering occurs spontaneously (without heating) when two nanoparticles are sufficiently close to one another. In some exemplary embodiments of the invention, sufficient proximity is achieved by decreasing the repulsion potential between particles, for example by modifying a stabilizer and/or adjusting conditions to favor flocculation.

According to various exemplary embodiments of the invention which employ stabilizers, modification of the stabilizer can include one or more of destruction of the stabilizer, removal of the stabilizer or altering physical and/or chemical properties of the stabilizer molecule.

Optionally, heating may contribute to one or more of these modification types. Traditionally, heating has used to destroy stabilizers. In some exemplary embodiments of the invention, removal and/or changes in chemical properties of the stabilizer are achieved without heating.

In some exemplary embodiments of the invention, sintering is conducted at higher temperatures. Optionally, the higher temperatures are above 200, 300, 400, 500, 600, 700 or 800 degrees centigrade.

Exemplary Flocculation Strategies

According to various exemplary embodiments of the invention flocculants are provided in the ink used to print the pattern and activated after pattern formation.

In other exemplary embodiments of the invention, flocculants are applied to the substrate separately from the ink.

According to various exemplary embodiments of the invention separate flocculant application can involve pre-treatment of substantially all of a substrate surface, or a selected region thereof, or re-printing the pattern using a flocculant solution. Optionally, re-printing can occur before or after printing of the pattern using an ink containing the nanoparticles. In some exemplary embodiments of the invention, the reprinting is substantially in alignment with the pattern applied to the substrate with ink containing the nanoparticles.

Exemplary Metal Formulations

According to various exemplary embodiments of the invention, each of Me1 and Me2 are independently provided as a single metal or a mixture or alloy of two or more metals. Optionally, Me1 and/or Me2 are initially provided as metal salts. In some exemplary embodiments of the invention, Me2 is added to Me1 nanoparticles as a solution of an Me2 salt. In other exemplary embodiments of the invention, Me2 is added to Me1 nanoparticles in a solid for such as, for example, crystals of an Me2 salt.

According to some exemplary embodiments of the invention, absence of any reducing agent other than Me1 when Me2 is reduced, contributes to an increased likelihood that reduced Me2 ions will adhere to Me1 nanoparticles and/or a reduced likelihood that Me2 nanoparticles will form nanoparticles of only Me2.

Exemplary Substrates

In some exemplary embodiments of the invention, a substrate upon which a pattern is printed comprises paper (e.g. regular paper or photo paper) and/or a ceramic and/or a metal and/or a semiconductor and/or a plastic. Ceramics suitable for use as substrates include, but are not limited to glass and/or silicon. Plastics suitable for use as substrates include, but are not limited to, polyimide films, transparency films, PET (polyethylene terphtalate), polycarbonate (PC) and PVC (poly vinyl chloride).

Metals suitable for use as substrates include but are not limited to include but are not limited to Aluminum and Aluminum alloys.

Exemplary Advantages

In some exemplary embodiments of the invention, use of metal nanoparticles in ink-jet inks provides a process for non-contact deposition of metallic structures with high conductivity on various substrates. Optionally, conductivity is increased after deposition. Benefits of direct and digital printing include, but are not limited to low cost fabrication of computer-defined integrated circuits for microelectronics.

In some exemplary embodiments of the invention, ink containing metal nanoparticles is sinterable at temperatures much lower than a melting point of the bulk metal, perhaps due to the nanometric size. Optionally, low temperature sintering allows formation of conductive patterns on substrates which can not withstand high temperatures, such as plastics (commonly used in smart cards) and paper.

Previously, the high cost of silver inks, especially those intended for ink-jet applications, has been a deterrent to their use.

Fe, Co, Ni and Cu have conductivities of 96.1, 62.4, 69.3 and 16.78 n$\Omega$m, respectively, which are comparable with the conductivity of silver (15.87 n$\Omega$m). Therefore, nano-sized particles of such metals were previously recognized as promising materials for fabrication of conductive inks as well as for conductive coatings. However, Fe, Co, Ni and Cu nanoparticles met were easily oxidized at ambient conditions and/or subject to aggregation and/or precipitation to an unacceptable degree.

In some exemplary embodiments of the invention, these metals are protected against oxidation during preparation and storage. Methods disclosed hereinabove make possible preparation of protected metal nanoparticles and/or structures in aqueous media and/or at high precursor concentration and/or in ambient air.

Alternatively or additionally, some exemplary embodiments of the invention provide Fe, Co, Ni and Cu containing nanoparticles in high concentration aqueous dispersions suitable for use as ink-jet inks. Exemplary embodiments described hereinabove and exemplified below are stable with respect to aggregation and/or oxidation to a previously unreported degree.

Alternatively or additionally, methods disclosed hereinabove are simple and/or inexpensive.

Alternatively or additionally, patterns printed from the disclosed dispersions of nanoparticles are characterized by low resistivity (i.e. similar to resistivity of bulk metal at temperatures much below the melting point of bulk metal).

Alternatively or additionally, method for the formation of core-shell metal nanoparticles disclosed herein enable tunable shell thickness.

In some exemplary embodiments of the invention, the disclosed Me1 core/Me2 shell configuration contributes to fabrication of inks applicable for printing of conductive patterns on circuit boards (PCB) and/or smart cards and/or RFID.

It is expected that during the life of this patent many dispersants and/or flocculants will be developed and the scope of the invention is intended to include all such new technologies a priori.

As used herein the term "about" refers to ±10%.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

Specifically, a variety of numerical indicators have been utilized. It should be understood that these numerical indicators could vary even further based upon a variety of engineering principles, materials, intended use and designs incorporated into the invention. Additionally, components and/or actions ascribed to exemplary embodiments of the invention and depicted as a single unit may be divided into subunits. Conversely, components and/or actions ascribed to exemplary embodiments of the invention and depicted as sub-units/individual actions may be combined into a single unit/action with the described/depicted function.

Alternatively, or additionally, features used to describe a method can be used to characterize an apparatus and features used to describe an apparatus can be used to characterize a method.

It should be further understood that the individual features described hereinabove can be combined in all possible combinations and sub-combinations to produce additional embodiments of the invention. The examples given above are exemplary in nature and are not intended to limit the scope of the invention which is defined solely by the following claims. Specifically, the invention has been described in the context of ink jet printing but might also be used in the context of other printing technologies.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The terms "include", and "have" and their conjugates as used herein mean "including but not necessarily limited to".

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

Example 1

Formation of Copper Nanoparticles and Consumption of Hydrazine Reducing Agent

In order to provide copper nanoparticles for use as Me1 cores in multi-metallic nanoparticles, an aqueous dispersion of Cu nanoparticles was prepared by reduction of $Cu(NO_3)_2$ with an excess of hydrazine hydrate in the presence of polyacrylic acid sodium salt as a polymeric stabilizer, as previously reported [M. Grouchko, A. Kamyshny, K. Ben-Ami, S. Magdassi, *J. Nano. Res.* 2008, 11, 713-716]. A 100 ml aliquot of the obtained dispersion of Cu nanoparticles (about 0.1 wt % Cu) with an average size of about 35 nm was diluted with 1000 ml of triple distilled water followed by drop wise addition of 1.0 ml acetaldehyde while stirring.

Addition of acetaldehyde to the dispersion to consume the hydrazine did not oxidize the Cu nanoparticles as evidenced by the fact that there was no change in absorption peak size and/or intensity as measured by a UV-Vis spectrophotometer).

However, exposure of the dispersion to air led to immediate oxidation of the Cu Nanoparticles accompanied by loss of the characteristic red color. These results indicate that Cu Nanoparticles are rapidly oxidized in the absence of some protective agent or antioxidant.

Example 2

Formation of Copper Nanoparticles and Washing of Hydrazine Reducing Agent

In order to test the feasibility of washing out the hydrazine reducing agent excess, separation of the nanoparticles from the hydrazine present in solution was carried out. The Cu Nanoparticles were prepared as described in example 1 and then were aggregated for easy separation form the solution. The aggregation was triggered by pH modification by the titration of nitric acid to achieve pH 2.7. The obtained supernatant was decanted and the sediment (aggregates of Nanoparticles) was re-dispersed in alkaline water.

This example demonstrates that a dispersion of Cu nanoparticles with no reducing agent can be achieved.

Example 3

Formation of Cu Nanoparticles without Silver Seeds

In order to establish the feasibility of producing Me1 cores in the absence of seed metal particles, Cu Nanoparticles were synthesized as in examples 1 and 2, but without silver seeds. Briefly, 20 ml of copper nitrate (10 wt %) and 20 ml of 10 wt % polyacrylic acid sodium salt (MW 8000) were added to 366 ml water heated to 95° C. Then, 1.2 ml of hydrazine hydrate (100 wt %) were added while stirring. After 20 minutes a red wine color dispersion of 30-40 m Cu Nanoparticles was obtained.

This example demonstrates that the silver seeds are not essential for Me1 nanoparticle formation.

Example 4

Influence of Temperature on Size of Me1 Nanoparticles

In order to establish the influence of temperature on the size of Cu nanoparticles formed by the method of example 3, syntheses were conducted at various temperatures in the range of 30 to 98° C.

Figure 2A:
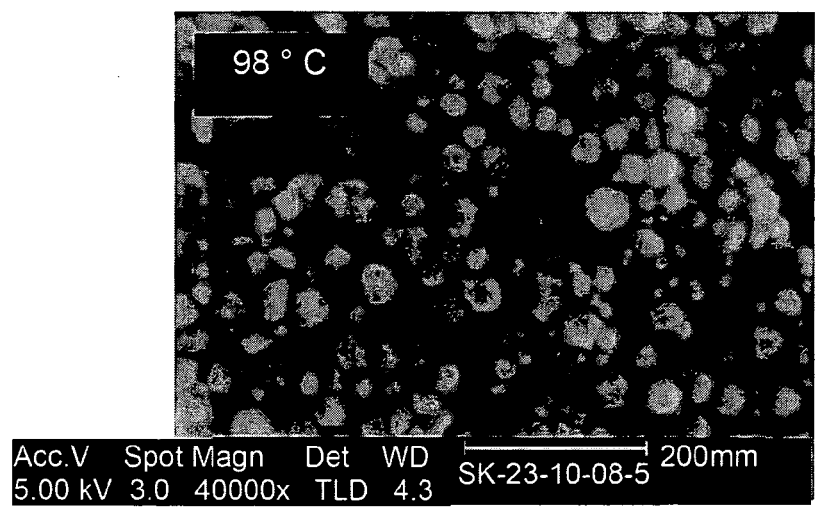
FIGS. 2A, 2B and 2C are scanning electron micrographs (SEM) of nanoparticles formed by a method according to an exemplary embodiment of the invention at reaction temperatures as indicated.
Figure 2B:
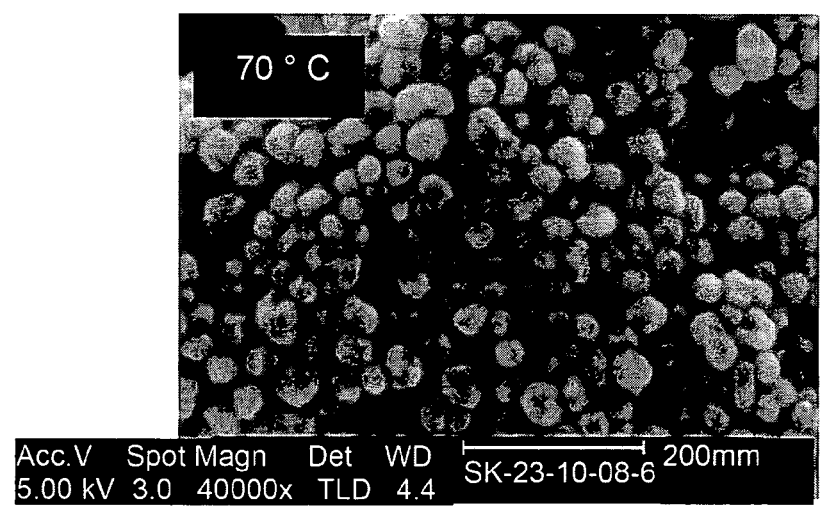
Figure 2C:
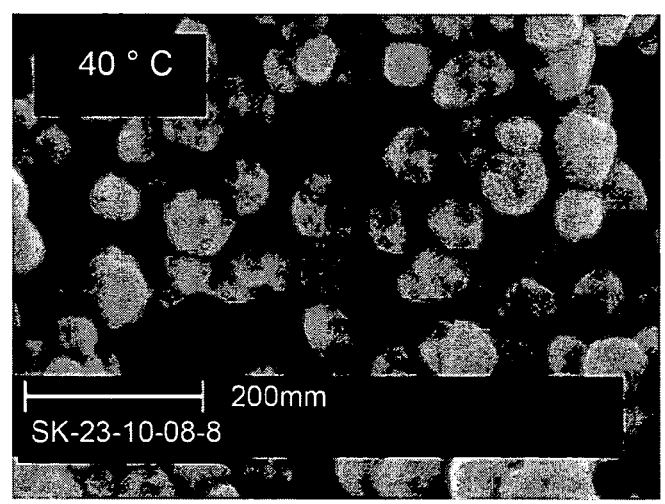

Results presented in FIG. 2 shows that the obtained particle size increases while the reaction temperature decrease.

Panel A ~30 nm particles at 98° C.;
Panel B ~50 nm at 70 degrees centigrade; and
Panel C ~80 nm particles at 30 degrees centigrade.

These results demonstrate that is possible to form core nanoparticles of desired sizes by varying temperature conditions.

Example 5

Formation of Cu Nanoparticles Via Reduction by Sodium Formaldehyde Sulfoxilate)

In order to establish that water soluble reagents other than hydrazine can be used to produce core nanoparticles of Me1, 30 gr of copper acetate was dissolved in 278.4 ml of water in the presence of 50.4 gr of aminomethyl propanol (AMP) and 36 gr of 45 wt % polyacrylic acid sodium salt (MW 8000). After 10 minutes of heating and stirring at 95° C., 71.4 gr of 30 wt % sodium formaldehyde sulfoxilate (Rongalite) were added while stirring. The rongalite serves as a reducing agent in place of hydrazine. After 10 minutes the mixture was transferred to an ice bath. The obtained precipitate was washed as described in Example 2

Figure 3A:
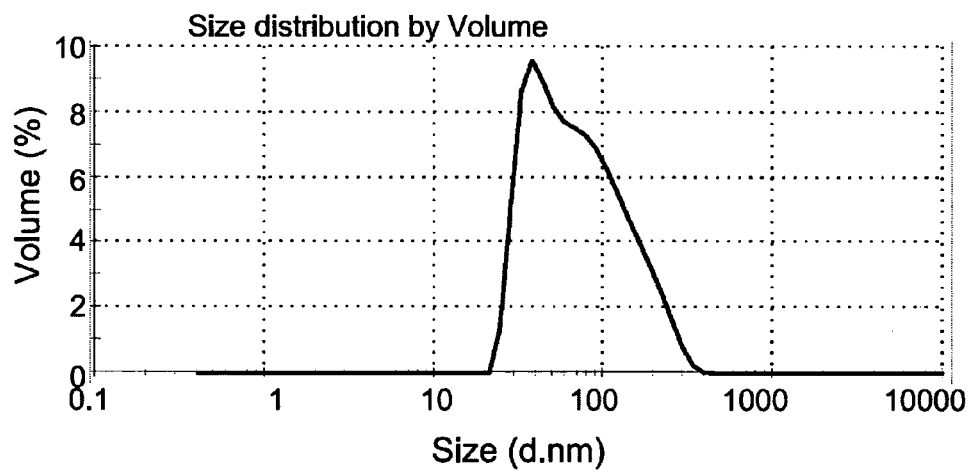
FIGS. 3A, 3B and 3C depict Dynamic Light Scattering (3A), SEM (3B) and X-Ray diffraction (3C) data for copper nanoparticles according to an exemplary embodiment of the invention
Figure 3B:
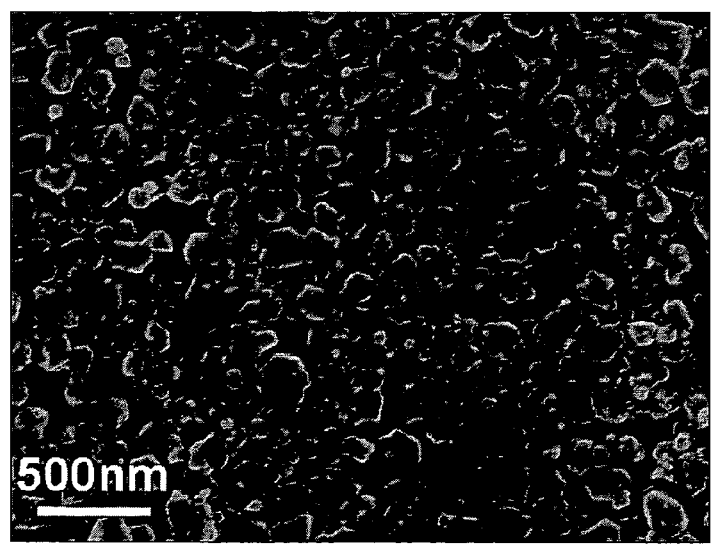
Figure 3C:
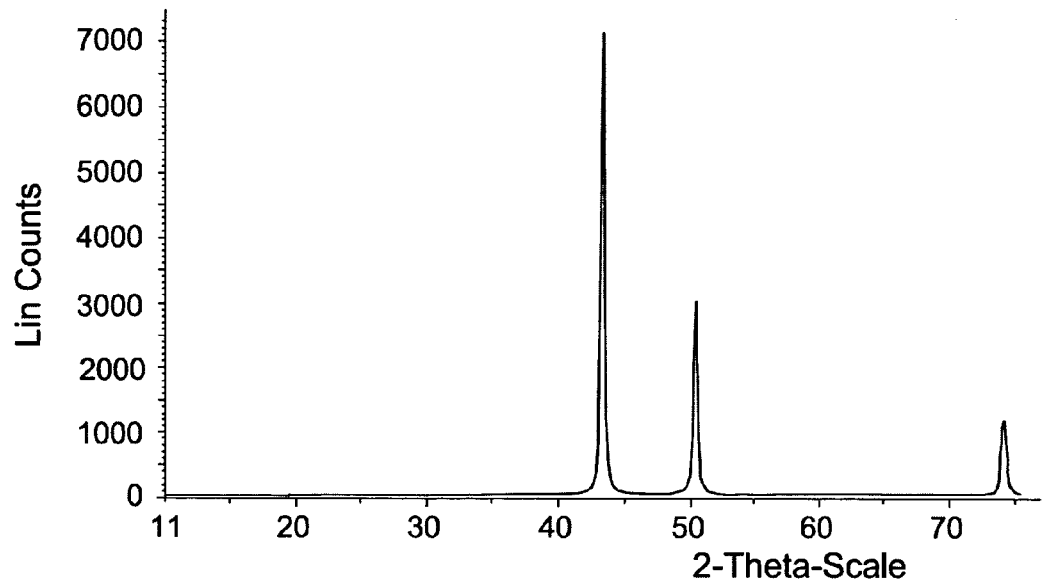

Characterization of the resultant nanoparticles by XRD, dynamic light scattering and HR-SEM, presented in FIG. 3, revealed the formation of copper nanoparticles with a diameter of 40 to 250 nm (Panel B).

Panel A shows dynamic light scattering data indicating that the particles size distribution in dispersion is at the range of 20 to 350 nm.

Panel C shows XRD (X-ray diffraction) data indicating the obtained nanoparticles have the face centered cubic (fcc) copper structure.

These results demonstrate that copper nanoparticles can be synthesized with very high concentration of copper in aqueous solution without hydrazine as reducing agent.

Example 6

Formation of Cu-Core/Ag-Shell Multi-Metallic Nanoparticles

In order to produce core/shell multi-metallic nanoparticles, silver nitrate solution was added to the hydrazine free dispersion of preformed copper nanoparticles produced in example 1 to form the silver shell. The silver ions were reduced by the copper atoms on the surface of the copper core according to the following reaction;

$$2Ag^+ + Cu^0 \rightarrow 2Ag^0 + Cu^{2+} \qquad \text{Equation 1}$$

More specifically, 5 minutes after the addition of the acetaldehyde in Example 1, 1.0 to 30.0 ml of 1 wt % silver nitrate was added drop-wise while stirring. The obtained dispersions of about 35 nm copper-silver core-shell Nanoparticles are characterized by an orange-reddish color which, in contrast to the uncoated Cu Nanoparticles, remains unchanged in an open vial. After drying the dispersion and exposure to air, the color of the powder also does not change.

This indicates that a silver shell on the copper nanoparticles protects them from oxidation.

The concentration of added silver nitrate and/or the size of the copper nanoparticles contributes to a thickness of the resultant silver shell.

Figure 4C:
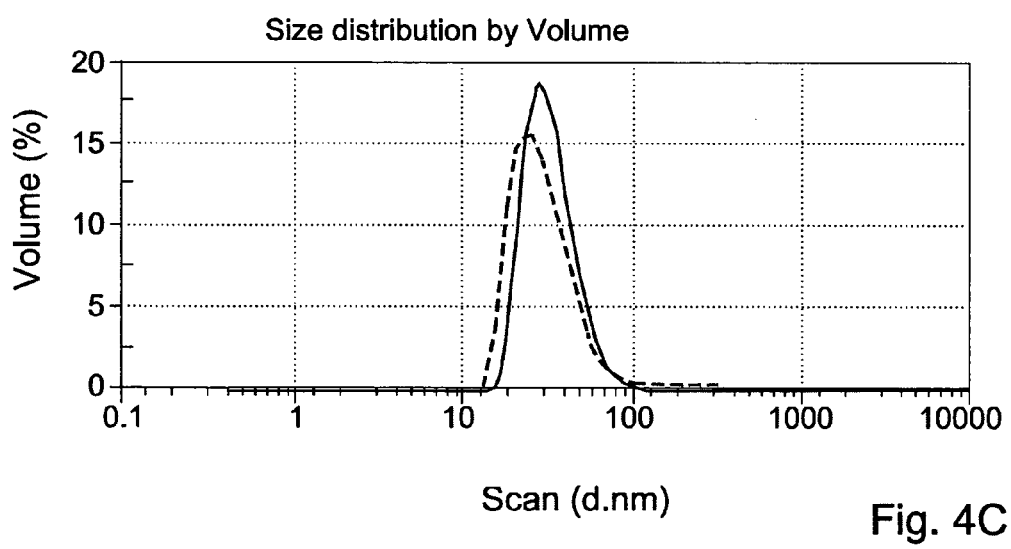
FIGS. 4A, 4B and 4C are high resolution transmission electron micrographs (HR-TEM) of uncoated copper nanoparticles (4A), Copper core/silver shell nanoparticles (4B), a graph of particle size distribution according to Dynamic Light Scattering (DLS) (4C) (Dashed line—uncoated copper nanoparticles; solid line—Copper core/silver shell nanoparticles)

FIG. 4 presents high resolution transmission electron microscopy (HR-TEM) images of the Cu Nanoparticles and Cu—Ag core-shell Nanoparticles as well as particle size distribution according to dynamic light scattering.

Panel a of FIG. 4 is a HR-TEM photo of the uncoated copper nanoparticles.

Panel b of FIG. 4 is a HR-TEM photo of copper core nanoparticles surrounded by a continuous silver shell, and Panel c of FIG. 4 presents particle size distribution of the nanoparticles depicted in panels a and b according to DLS (Dashed line—copper nanoparticles as in panel a, solid line—copper core nanoparticles surrounded by a continuous silver shell as in panel b).

Characterization of core-shell dispersion as well as powder by XRD, EDS (energy dispersive spectrometry) in STEM (scanning transmission electron microscope), SAED (selected area electron diffraction) in TEM, UV-Vis (ultraviolet-visible) spectrophotometer and XPS (X-ray photoelectron spectroscopy) revealed and confirmed the core-shell structure (data not shown).

Results from Example 6 demonstrate that Me1-Me2 core-shell structure nanoparticles can be achieved by the reduction of Me2 ions at the surface of Me1 nanoparticles by the Me1 nanoparticle surface atoms.

Example 7

Formation of Empty Ag Shell Nanoparticles

In order to demonstrate the feasibility of producing Me2 shells substantially free of Me1 cores, multi-metallic nanoparticles with a copper core and a silver shell were formed as in example 6. The copper cores were selectively removed by dissolution. In order to confirm the formation of a silver shell, a process of dissolution of the copper core was performed. A 25% ammonium hydroxide solution was added to the obtained copper-silver core-shell Nanoparticles. In order to promote the dissolution process, the dispersion was treated by a vortex and sonication bath. Since ammonium hydroxide dissolves copper, washing produced silver nanoshells.

These results suggest that some of the silver shells had holes which enabled the ammonia to penetrate and dissolve the copper core.

If the shells had been formed by aggregation of pre-existing Me2 nanoparticles (silver in this example), removal of the core would have been expected to disrupt the shell structure. Persistence of the shell structure in the absence of the core confirms that the shells are composed of continuously fused Me2 atoms.

Figure 5A:
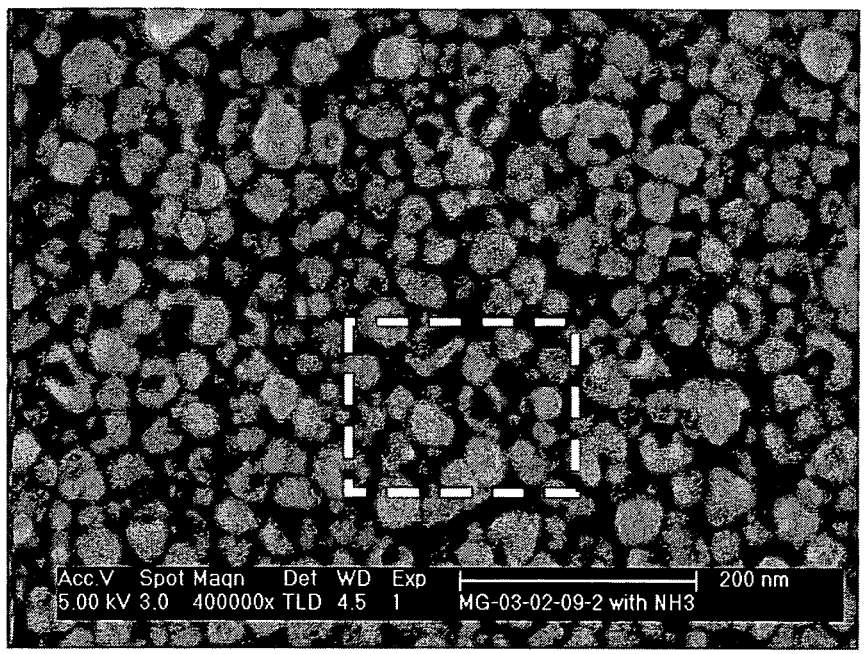
FIGS. 5A and 5B are electron micrographs of silver shells with copper cores removed according to an exemplary embodiment of the invention (Panel B is a higher magnification view of the dotted rectangle in Panel A)
Figure 5B:
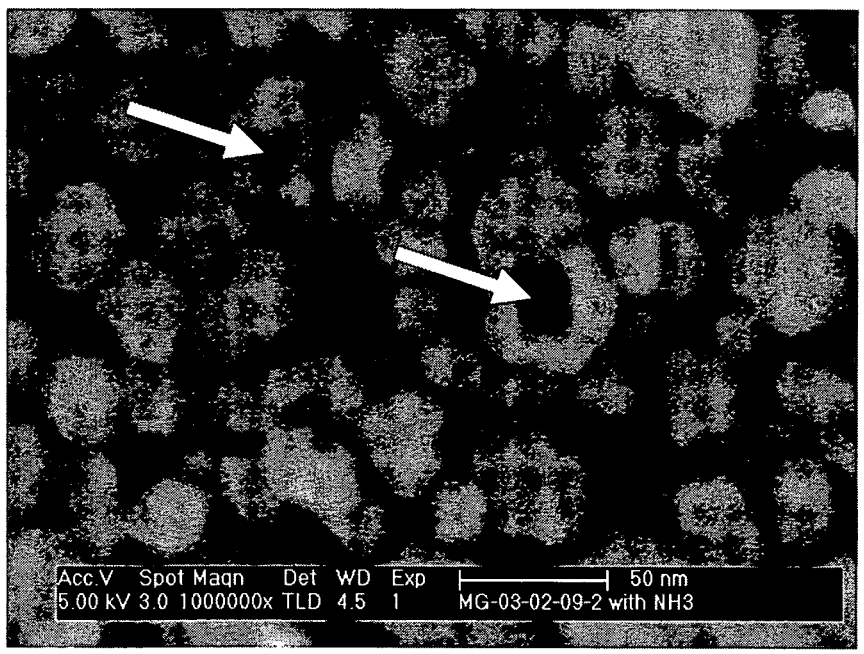

As depicted in the electron-micrographs of FIGS. 5A and 5B, at least some of the silver nanoshells were apparently disrupted (probably by the sonication), revealing their uniform thickness with respect to the dissolved cores. FIG. 5 B is a higher magnification view of the area indicated by a dashed rectangle in FIG. 5A. Cavities remaining from dissolved Me1 cores are indicated by arrows.

This ability to obtain nanoshells from the core-shell nanoparticles indicate that the shell formed on the copper core is composed of a thin layer of atoms rather than a layer of nanoparticles. If the shell was composed of nanoparticles, then while removing the copper core, the shell would collapse and no shell remains would have been seen.

Example 8

Use of Silver Acetate to Form Silver Shells on Copper Nanoparticles

In order to establish that various Me2 salts could be used to prepare a continuous coating on Me1 nanoparticles, copper nanoparticles from Example 5 were coated by a thin silver shell after a washing, by the drop wise addition of silver acetate solution.

Briefly, 250 ml 0.5 wt % silver acetate solution was added drop wise to 50 gr copper nanoparticles (5 wt % copper) dispersion. The pH was adjusted during the silver acetate addition, by the titration of AMP (20 wt % solution) to the range of 8.5<pH<10.

Examples 6 and 8 demonstrate that various salts of an Me2 such as silver, can be used to form a coating on a nanoparticle of an Me1 such as copper at various concentrations of Me1 and Me2.

Example 9

Purification and Concentration of Dispersions of Me1-Me2 Core-Shell Nanoparticles In order to establish the feasibility of preparing conductive inks, a dispersion of Cu—Ag core-shell Nanoparticles prepared according to example 6 was washed and concentrated by a precipitation-centrifugation-decantation process.

More specifically, the dispersion of synthesized Cu—Ag core-shell nanoparticles was acidified to pH 2.9 by a drop-wise addition of 6.5% nitric acid while stirring. As in example 2. the acidification changes the stabilizing nature of the carboxylic group (from COO— to COOH) propagating the aggregation of the nanoparticles. This aggregation enables the separation of the nanoparticles from the solution, i.e. enable their washing.

The acidified dispersion was washed and re-suspended by centrifugation for two minutes at 800 g, decantation of the supernatant and dispersal of the resultant pellet by adjusting the pH to 9 with 2-amino-2-methyl-1-propanol. The alkaline conditions de-protonate the carboxylic group (from COOH to COO—), providing the nanoparticles a net charge enabling their redispersion.

This washing and resuspension process was repeated three times. Finally the obtained precipitate was re-dispersed in distilled water; the pH was adjusted to pH 9 by the addition of 2-amino-2-methyl-1-propanol to obtain a stable concentrated dispersion with metal concentration of between 1 to 80 wt %.

The washed dispersion was treated in an ultrasonic bath (Branson 1510) for 10 min. Ultrasonic treatment contributed to effective dissociation of aggregates. Dissociation was sufficiently effective that the dispersion was suitable for use as an ink as evidenced by FIG. 6A in example 11.

These results indicate that it is feasible to produce a dispersion of Me1-Me2 core-shell nanoparticles at a weight concentration of 1 to 80% for use as an ink.

Example 10

Preparation of Copper-Silver Core-Shell Nano-Powder

In order to establish that the Me1-Me2 nanoparticles retain their unique characteristics when dried, the concentrated dispersion from example 9 was further lyophilized to yield a powder, optionally in the presence of a wetting agent (for example, 1-0.1 wt % BYK 348).

BYK®-348 (BYK USA Inc; Wallingford Conn.) is a silicone surfactant for aqueous systems which provides powerful reduction in surface tension. (Composition: Polyether modified dimethylpolysiloxane) which leads to excellent substrate wetting and leveling without foam stabilization.

The resultant powder can be easily re-dispersed in water to yield a much more concentrated dispersion, up to 80 wt % of metal dispersed in aqueous solution, without changes in the average particle size of Cu—Ag core-shell Nanoparticles compared to the original dispersion.

It is believed that other drying procedures such as spray drying could be substituted for lyophilization.

These results indicate that appropriate use of a wetting agent allows drying of the multi-metallic nanoparticles and resuspension at virtually any desired concentration.

Example 11

Use of Inks Containing Cu—Ag Core-Shell Nanoparticles

In order to prepare ink (e.g. for use in an ink jet printer), a pellet of Cu—Ag core-shell nanoparticles as prepared in Example 9 was resuspended at 5 to 80 wt % by the addition of a precise amount of triple distilled water. The pH was adjusted to pH 9 by the addition of 2-amino-2-methyl-1-propanol and then BYK 348 at a concentration of 0.05 to 0.1 wt % was added. to adjust surface tension. The obtained formulation was treated in an ultrasonic bath (Branson 1510) for 10 min. to disperse the nanoparticles.

The suitability of the resultant ink for ink-jet printing was evaluated in a Lexmark Z615 ink-jet printer and JetDrive III controller (MicroFab) with a 60 μm orifice print head.

An ink-jet formulation and the pulse shape is described in the following example. Printing was performed on various substrates, such as paper, photo-paper, polyimide films, transparency films, PET (polyethylene terphtalate) glass and PVC (poly vinyl chloride).

In general Cu—Ag core-shell Nanoparticles in aqueous medium are rendered suitable for use ink-jet ink by addition of surfactants and/or additional polymers such as binders and/or rheology modifiers and/or humectants and/or co solvents and/or buffering agents and/or antimicrobial agents and/or defoamers. These ingredients optionally contribute to desired jetting and/or adhesion properties of the ink to specific substrates.

Figure 6A:
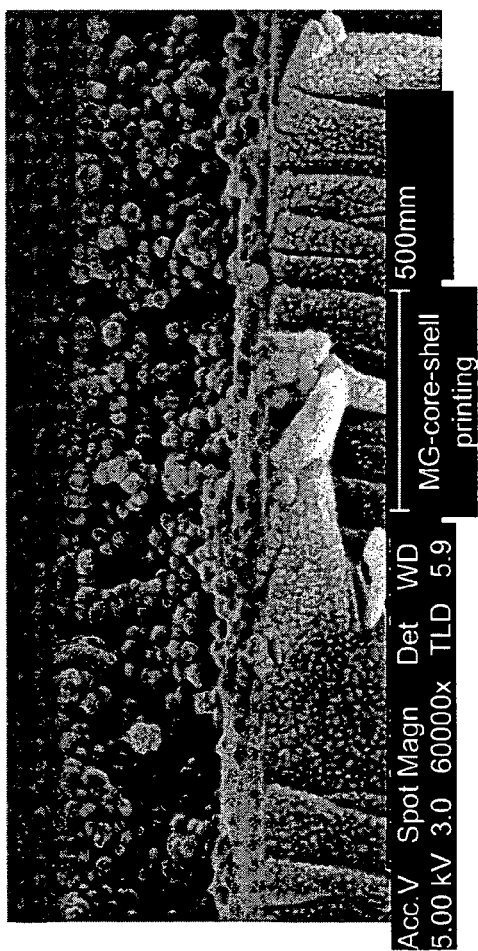
FIGS. 6A and 6B depict results from printing a 25 wt % dispersion of Copper core/silver shell nanoparticles according to an exemplary embodiment of the invention; (6A) is an HR-SEM image of a printed pattern cross-section and (6B) is a photograph of an antenna printed using the same dispersion and a Lexmark office printer on an ink jet photo paper.

FIG. 6a is a HR-SEM cross-sectional image of a line printed on glass indicating that the printed line (400 nm thickness) is composed of closely packed nanoparticles.

Figure 6B:
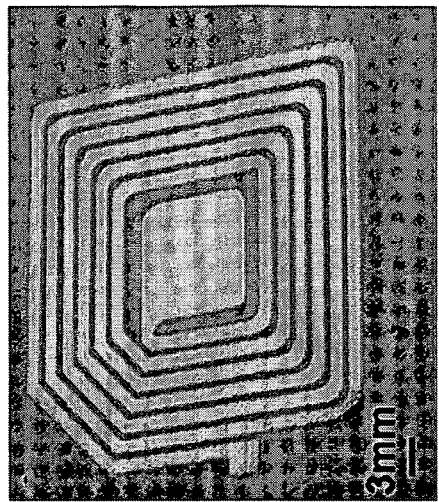

FIG. 6b is an RFID antenna printed using 25 wt % Cu—Ag core-shell Nanoparticles in a Lexmark office printer on inkjet photo paper which represents one exemplary application according to some embodiments of the invention. This antenna is characterized by a metallic brightness and a mirror like reflection.

Example 12

Additional Inks and Ink Jet Printing

In order to demonstrate additional applications of Me1-Me2 nanoparticles according to exemplary embodiments of the invention in ink jet printing, a dispersion of copper-silver core-shell nanoparticles (25 wt %) with 0.1 wt % BYK 348 was printed by JetDrive III (MicroFab) with a pulse shape: Rise: 5 μs, Dwell: 20 μs, Fall: 5 μs, Echo: 50 μs, Final rise: 5 μs, and voltage between 100 and −100 V.

The stability of these core-shell nanoparticles and dispersions to oxidation was evaluated by various techniques.

Figure 7A:
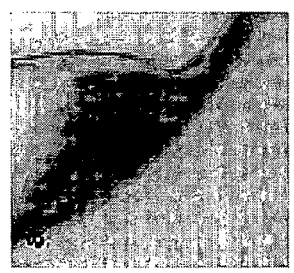
FIG. 7A is photograph of a dried pattern formed (not printed) using multi-metallic nanoparticles according to an exemplary embodiment of the invention on a Petri plate stored in air, at room temperature.

FIG. 7a is photograph of a dried pattern formed (not printed) on a Petri plate demonstrating graphically that the dried nanoparticles preserve the dispersion's red color while stored in air, at room temperature.

Figure 7B:
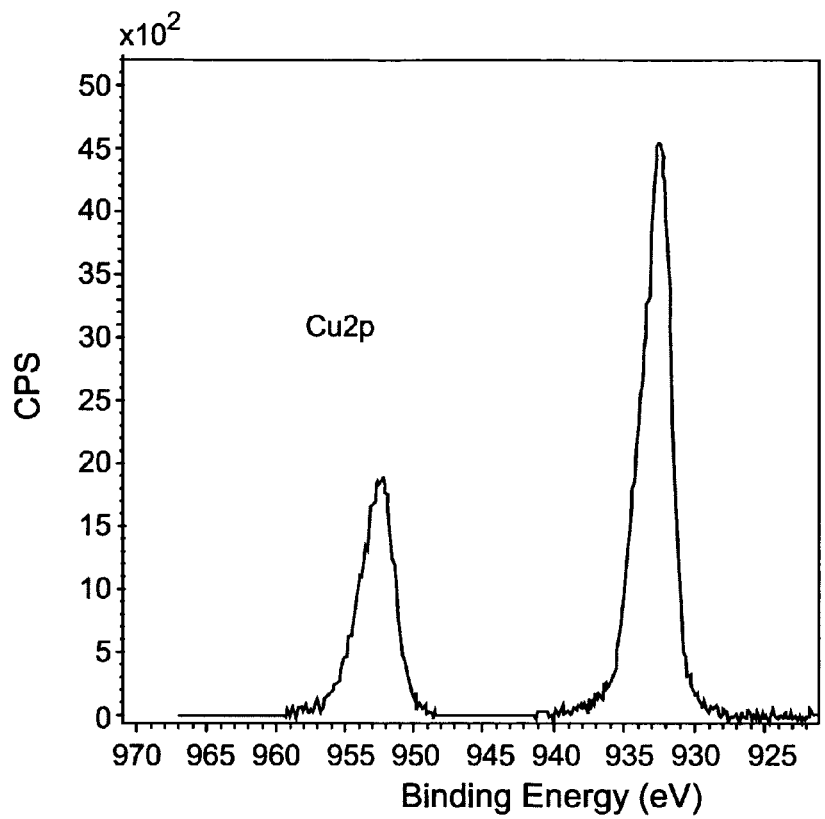
FIGS. 7B and 7C are plots of XPS and XRD analyses of multi-metallic nanoparticles according to an exemplary embodiment of the invention respectively showing peaks indicative of Cu and Ag only, without oxides of either metal.
Figure 7C:
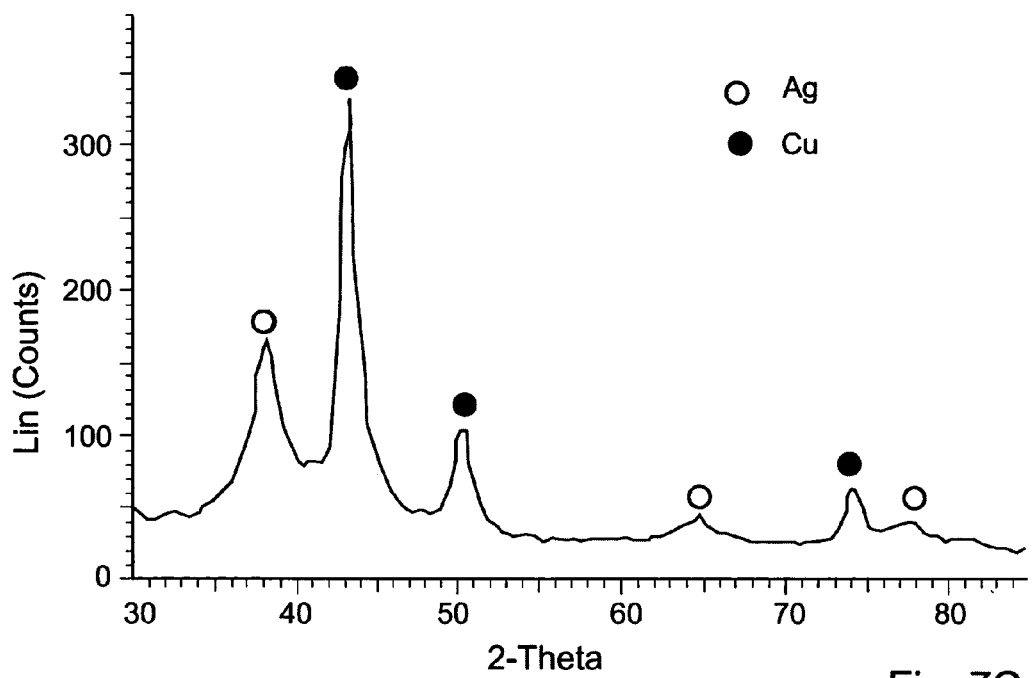

FIGS. 7b and 7c are plots of XPS and XRD analyses respectively showing peaks indicative of Cu and Ag only, without oxides of either metal.

Figure 7D:
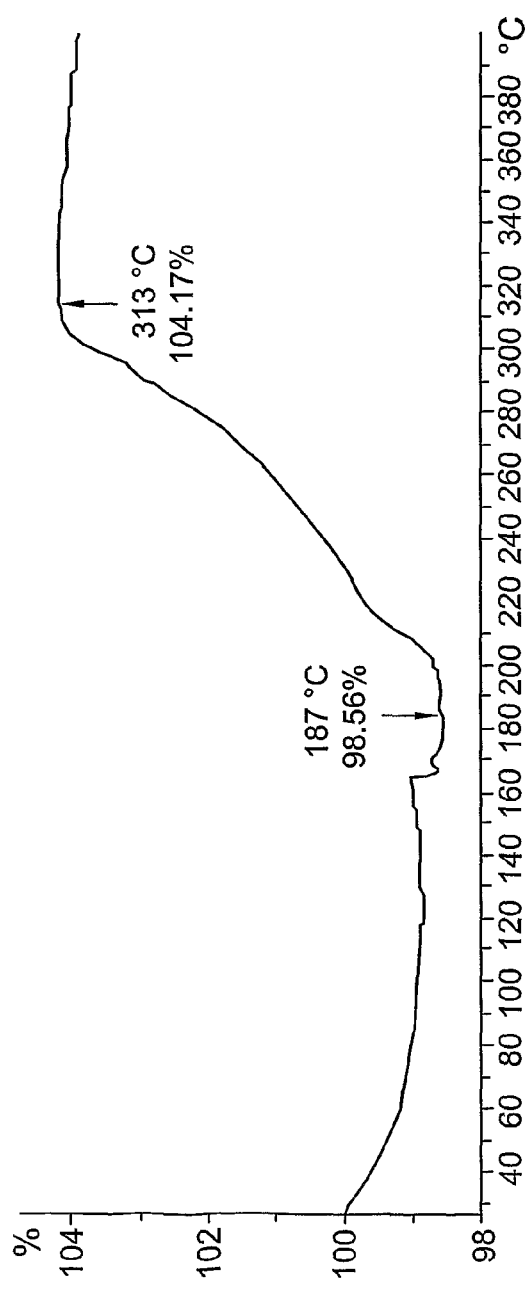
FIG. 7D is a TGA (thermo gravimetric analysis) graph of multi-metallic nanoparticles according to an exemplary embodiment of the invention.
Figure 7E:
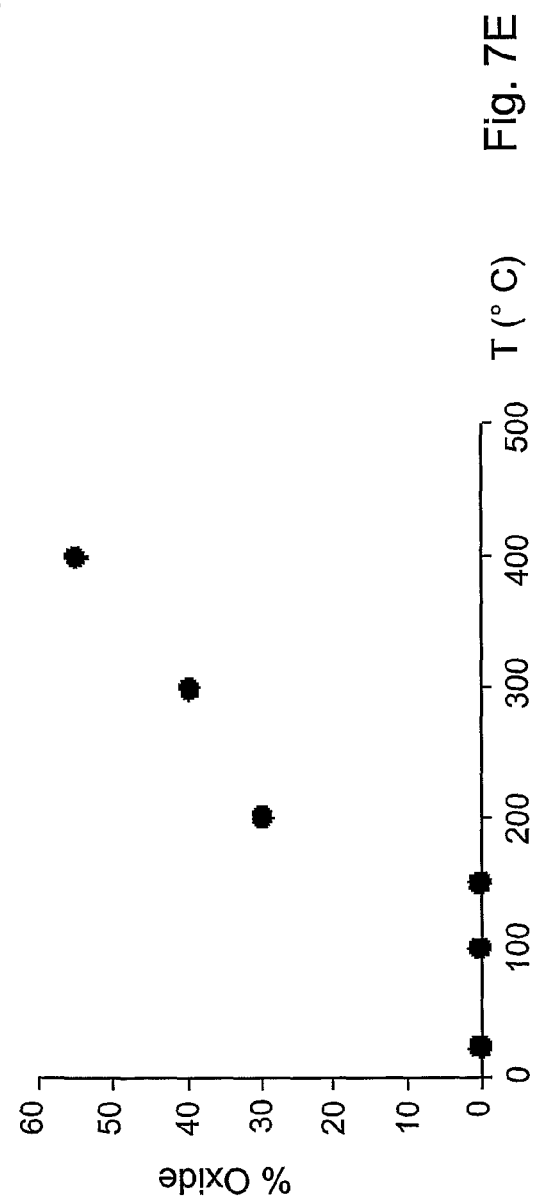
FIG. 7E is a graph of % copper oxides as a function of temperature as measured by XRD for multi-metallic nanoparticles according to an exemplary embodiment of the invention.
Figures 8A, 8B:
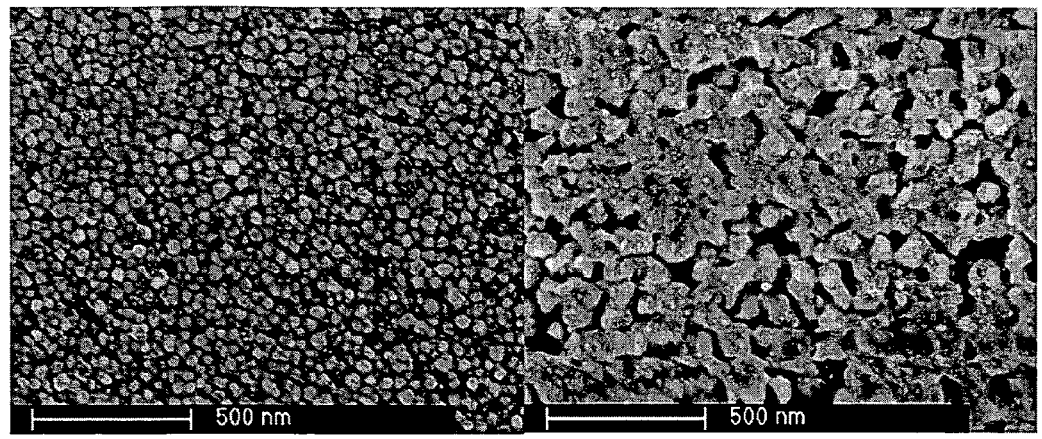
FIGS. 8A and 8B are electron micrographs of printed patterns of multi-metallic nanoparticles according to an exemplary embodiment of the invention on photo paper (8A) and on the same paper treated with 8 wt % phosphoric acid (8B)

FIG. 7e is a graph of % copper oxides as a function of temperature as measured by XRD indicating no copper oxides were detected even after heating to 150° C. in open air. At temperatures over 200 degrees centigrade, significant oxidation was measured.

FIG. 7d is a TGA (thermo gravimetric analysis) graph. As seen in the graph, up to 187° C. the sample mass decrease, due to the evaporation of water. Only at a temperature higher than 187° C. the mass starts to increase. This mass increase indicates the oxidation of the copper core to $Cu_2O$ and CuO.

This data indicates that Me2 effectively prevented oxidation of Me1 at all temperatures up to 186° C.

Example 13

Principles of Production of Conductive Patterns

In order to obtain conductive patterns the nanoparticles composing the printed patterns must be close packed or sintered. The conventional way to achieve the sintering is to heat the pattern in order to increase the atoms diffusion at the nanoparticles surface so interconnections between the nanoparticles are formed (Dongjo Kim et al. Electrochemical and Solid-State Letters, 8, 11, J30-J33, 2005). In some exemplary embodiments of the invention, a sintering process which doesn't require heating is presented. Optionally, sintering is achieved by a pretreatment of the substrate and/or post treatment of the printed pattern. Sintering without heating reduces application of energy to the substrate and/or preparation cost and/or equipment costs. In some exemplary embodiments of the invention, a reduction in the amount of applied energy during sintering contributes to an ability to sinter a pattern printed on a delicate substrate (e.g. paper or a thin plastic film)

In some exemplary embodiments of the invention, a flocculating agent contributes to sintering. Optionally, flocculating agents present in solution prior to application to the substrate contribute to aggregation and/or coagulation of the nanoparticles on the substrate and/or to coalescence of the nanoparticles after application to the substrate.

In some exemplary embodiments of the invention, a stabilizer that is adsorbed onto the Me1-Me2 nanoparticles' surface has carboxylic groups (for example polyacrylic acid, which in an alkaline medium provide the nanoparticles a net charge) addition of suitable electrolytes, polyelectrolytes or acids to the printed pattern, can lead to their spontaneous sintering.

According to various exemplary embodiments of the invention, the agent which causes the sintering of the nanoparticles may be present on the substrate prior to printing (a pre-treated substrate, or substrate which is composed of agents such as alumina) and/or coating the metallic nanoparticles and/or deposited onto the printed pattern by any means (printing, spraying, coating etc.)

Example 14

Sintering at Room Temperature on Photo Paper

In order to demonstrate the feasibility of producing a conductive pattern on a delicate substrate via low temperature sintering, the Cu—Ag core-shell inks as in Example 11 were printed by a Lexmark printer on an Epson photo paper.

Pre-treatment of the paper with 8 wt % phosphoric acid solution by an application rod (6 μm thickness) lead to sheet resistance of 3.0 (±0.2) Ωsquare.

Optionally, this resistance can be further decreased by proper selection of ink additives which prevent the formation of cracks upon drying, such as addition of wetting agents and/or leveling agents and/or binders and/or co-solvents.

Figures 4A, 4B:
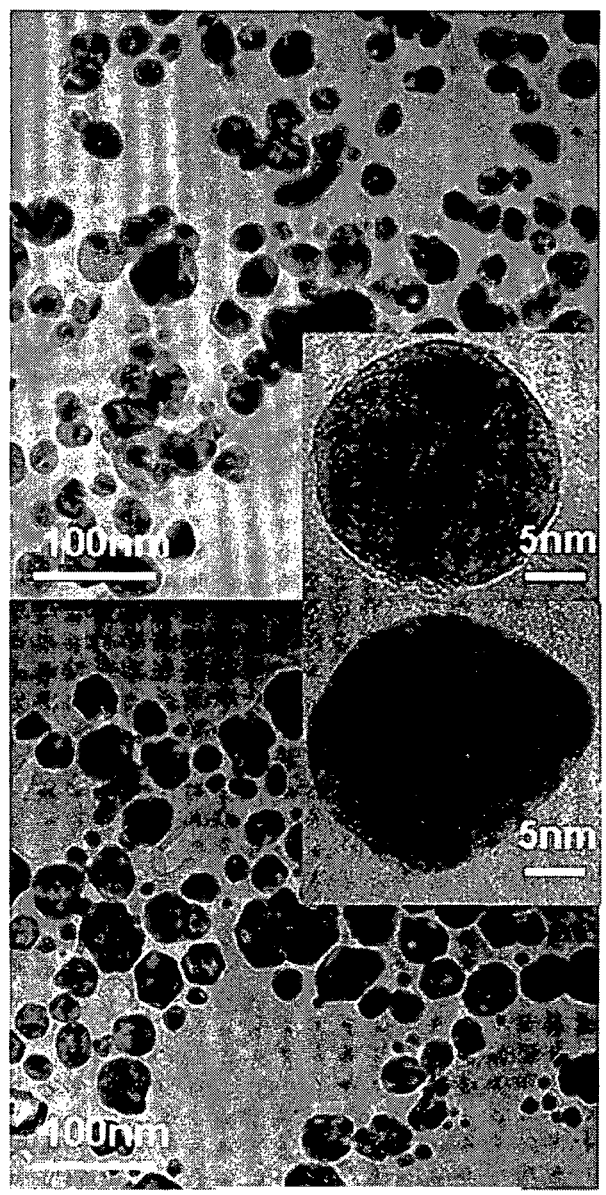

FIGS. 4a and 4b are SEM micrographs of Cu—Ag core-shell nanoparticles printed on untreated photo paper and similar paper pre-treated with 8 wt % phosphoric acid respectively. Panel 4b clearly indicates that the nanoparticles were sintered at room temperature. XRD data indicated that no copper oxides were present (data not shown).

Example 15

Additional Example of Sintering at Room Temperature on Photo Paper

In order to confirm the ability to obtain sintering without heating, 30 wt % copper-silver core-shell nanoparticles dispersion prepared as in Example 8 was deposited by an application rod (12 μm wet thickness) on an Epson photo paper. The obtained patterns were found to have a sheet resistance of 4.5(±0.5) Ωsquare without heating.

Results of examples 14 and 15 indicate that the method of preparation of the multi-metallic nanoparticles contributes to post printing sheet resistance.

Example 16

Exemplary Ink Formulations

Table 1 presents exemplary ink formulations according to various exemplary embodiments of the invention. Ink formulations of multi-metallic nanoparticles were formulated with various additives to impart desired properties to the ink.

BYK 348 was added as a wetting agent to decrease the surface tension.

DPM, Glycerol and propylene glycol were added as humectants.

PVP was added as a binder.

TABLE 1 exemplary ink formulations

| Exemplary ink formula | Cu/Ag nanoparticles dispersion (wt %) | BYK 348 (wt %) | DPM (wt %) | Glycerol (wt %) | Other As indicated (wt %) |
|---|---|---|---|---|---|
| 1 | 20 | 0.2. | NONE | NONE | NONE |
| 2 | 20 | 0.1 | NONE | NONE | NONE |
| 3 | 30 | 0.05 | NONE | NONE | NONE |
| 4 | 30 | 0.2 | NONE | NONE | NONE |
| 5 | 30 | 0.1 | NONE | NONE | NONE |
| 6 | 20 | 0.05 | NONE | NONE | NONE |
| 7 | 30 | 0.2 | 10 | NONE | NONE |
| 8 | 30 | 0.2 | NONE | 10 | NONE |
| 9 | 30 | 0.2 | 5 | NONE | NONE |
| 10 | 30 | 0.2 | 15 | NONE | NONE |
| 11 | 30 | 0.5 | NONE | NONE | NONE |
| 12 | 30 | 0.2 | NONE | NONE | 5 Propylene glycol |
| 13 | 30 | 0.2 | NONE | NONE | 0.2 PVP* 10,000. |
| 14 | 30 | 0.2 | NONE | NONE | 0.2 PVP 40,000. |
| 15 | 30 | 0.2 | NONE | NONE | 0.2 PVP 55,000. |
| 16 | 30 | 0.2 | NONE | NONE | 0.1 PVP 10,000. |

*(polyvinylpyrollidone)

What is claimed is:

1. An aqueous dispersion, comprising:
   (a) a plurality of core-shell nanoparticles having an average shell thickness of from 0.5 to 10 nm, each of said core-shell nanoparticles consisting of
      a copper core, and
      a shell material of a second metal (Me2) that is different from copper and has a reduction potential larger than the reduction potential of copper, wherein said Me2 shell material is in direct contact with said copper core, and Me2 prevents oxidation of the copper core at all temperatures below 186° C.; and
   (b) a water-soluble dispersion stabilizer,
   wherein the aqueous dispersion is free from non-core-shell Me2 nanoparticles.

2. The aqueous dispersion according to claim 1, further comprising an aqueous vehicle.

3. An ink-jet printing ink, comprising an aqueous dispersion according to claim 1.

4. A method for producing an aqueous dispersion of nanoparticles in at least one liquid vehicle, the aqueous dispersion being free from non-core-shell Me2 nanoparticles, the method comprising:
   (a) providing copper nanoparticles in an aqueous solution;
   (b) introducing to the aqueous solution a salt of a second metal (Me2), where Me2 is different from copper and has a reduction potential larger than the reduction potential of copper;
   (c) forming an Me2 shell on the copper nanoparticles by causing said copper metal to reduce Me2 ions to produce core-shell nanoparticles, wherein reduction is achieved without use of a reducing agent; and
   (d) dispersing said produced core-shell nanoparticles in said at least one liquid vehicle.

5. An aqueous dispersion of nanoparticles produced by the method according to claim 4, wherein said nanoparticles are core-shell nanoparticles, each of said core-shell nanoparticles consisting of
- a copper core, and
- a shell material comprising at least one second metal (Me2) that is different from copper and has a reduction potential larger than the reduction potential of copper,
- wherein said Me2 shell material is in direct contact with said copper, and wherein said dispersion is free from non-core-shell Me2 nanoparticles.

6. The aqueous dispersion according to claim 1, wherein said water-soluble dispersion stabilizer is selected from the group consisting of net negative charge stabilizers and net positive charge stabilizers.

7. The aqueous dispersion according to claim 6, wherein said water-soluble dispersion stabilizer is selected from the group consisting of compounds having carboxyl groups and compounds having amine groups.

8. The aqueous dispersion according to claim 1, wherein in the core-shell nanoparticles the atomic ratio of Me2 to copper is in the range of from 0.005 to 2.

9. The aqueous dispersion according to claim 1, wherein the diameter of the copper nanoparticles is in the range of from 5 to 300 nm.

10. The aqueous dispersion according to claim 1, wherein the reduction potential of Me2 is higher than 0.7V.

* * * * *